(12) United States Patent
Yang

(10) Patent No.: US 9,383,146 B2
(45) Date of Patent: Jul. 5, 2016

(54) HEAT DISSIPATION DEVICE HAVING LATERAL-SPREADING HEAT DISSIPATING AND SHUNTING HEAT CONDUCTIVE STRUCTURE

(76) Inventor: Tai-Her Yang, Dzan-Hwa (TW)

( * ) Notice: Subject to any disclaimer, the term of this patent is extended or adjusted under 35 U.S.C. 154(b) by 756 days.

(21) Appl. No.: 13/554,075

(22) Filed: Jul. 20, 2012

(65) Prior Publication Data

US 2014/0022798 A1    Jan. 23, 2014

(51) Int. Cl.
| | |
|---|---|
| *F28F 3/06* | (2006.01) |
| *F21V 29/74* | (2015.01) |
| *F28D 21/00* | (2006.01) |
| *F21K 99/00* | (2016.01) |
| *F21Y 101/02* | (2006.01) |
| *F21V 29/83* | (2015.01) |

(52) U.S. Cl.
CPC . *F28F 3/06* (2013.01); *F21V 29/74* (2015.01); *F21K 9/00* (2013.01); *F21K 9/137* (2013.01); *F21V 29/83* (2015.01); *F21Y 2101/02* (2013.01); *F28D 2021/0029* (2013.01); *H01L 2924/0002* (2013.01)

(58) Field of Classification Search
CPC ............ F28F 21/062; F28F 3/06; G06F 1/20; G06F 2200/201; G06F 1/206; H05K 7/20963; G02B 7/1815; H01G 2/08; H01M 10/5004; A61B 18/02; A61F 2007/0056; F21V 29/02; F21V 29/22; F21V 29/74; F21V 29/83; H01L 23/427; H01L 2924/0002; H01L 2924/00; B60Q 1/44; B60Q 1/46; B60Q 1/302; B60Q 1/52; B60Q 2400/20; F21Y 2101/02; F21K 9/137; F21K 9/00; F28D 2021/0029
USPC .......... 62/324.1; 165/80.3, 104.33, 185, 80.5; 123/41.31, 41.01; 361/679.54, 696, 361/688, 697, 704, 709; 313/46; 118/666; 174/16.3, 548; 222/146.1; 347/171; 362/373, 547
See application file for complete search history.

(56) References Cited

U.S. PATENT DOCUMENTS 7,166,955 B2 *   1/2007   Coushaine ................ F21K 9/00
                                                                                                                                      313/46

* cited by examiner

*Primary Examiner* — Stephen F Husar
*Assistant Examiner* — Danielle Allen
(74) *Attorney, Agent, or Firm* — Bacon & Thomas, PLLC

(57) ABSTRACT

A heat dissipation device having lateral-spreading heat dissipating and shunting heat conductive structure, in which the central area of heat conductive interface of the heat dissipation device where a heat generating unit being disposed is installed with a close-loop shunting heat conductive structure, so the heat at the central area of the heat generating unit can be conducted to a distal heat dissipating segment for being dissipated to the exterior, thereby through working with the heat dissipation operation of the heat dissipation structure at the periphery of the heat generating unit and led to the distal heat dissipating segment, the temperature distribution at the central area and the peripheral area of the heat generating unit can be more even.

29 Claims, 19 Drawing Sheets

HEAT DISSIPATION DEVICE HAVING LATERAL-SPREADING HEAT DISSIPATING AND SHUNTING HEAT CONDUCTIVE STRUCTURE

BACKGROUND OF THE INVENTION (a) Field of the Invention

The present invention provides a heat dissipation device having lateral-spreading heat dissipating and shunting heat conductive structure, in which the central area of heat conductive interface of the heat dissipation device (100) where a heat generating unit being disposed is installed with a close-loop shunting heat conductive structure, so the heat at the central area of the heat generating unit (101) can be conducted to a distal heat dissipating segment (104) for being dissipated to the exterior, thereby through working with the heat dissipation operation of the heat dissipation structure at the periphery of the heat generating unit (101) and leaded to the distal heat dissipating segment (104), the temperature distribution at the central area and the peripheral area of the heat generating unit (101) can be more even.

(b) Description of the Prior Art

A conventional semiconductor having heat loss, e.g. a light emitting diode (LED), central process unit (CPU), memory, power semiconductor, rectifier, or power-type IC in which heat loss being generated, or an active heat generating unit, e.g. a heater, oven or cooking ware operated through electric power or thermal combustion, the heat source is often installed at the bottom central area of a heat dissipation device, and through a heat conductive structure radially and outwardly extending and upwardly extending, the heat can be conducted to a distal heat dissipation structure thereby dissipating the heat to the exterior; because the lateral edge area of the heat generating unit is closer to the heat conductive structure radially and outwardly extending and upwardly extending, while the central area of the heat generating unit is relatively farer, the temperature at the central area of the heat generating unit is higher than the temperature at the peripheral area during operation, thereby causing an disadvantage of the temperature between the central area and the lateral edge of the heat generating unit being uneven.

SUMMARY OF THE INVENTION

The present invention provides a heat dissipation device having lateral-spreading heat dissipating and shunting heat conductive structure, in which the top central area or the bottom central area of heat conductive interface of the heat dissipation device (100) where a heat generating unit (101) being provided is installed with be heat generating unit (101), the central area of heat conductive interface of the mentioned heat dissipation device (100) is installed with a close-loop shunting heat conductive structure, so the heat at the periphery of the heat generating unit (101) can be conducted from the outer periphery to the distal heat dissipating segment (104) for being dissipated to the exterior, and the heat at the central area can be conducted through the close-loop shunting heat conductive structure (103) to the distal heat dissipating segment (104) for being dissipated to the exterior.

DESCRIPTION OF MAIN COMPONENT SYMBOLS

Figure 1:
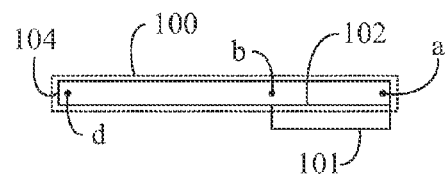
FIG. 1 is a temperature distribution diagram illustrating the bottom central area of a base structure (102) of a conventional heat dissipation device (100) outwardly expanded towards single side being installed with a heat generating unit (101).

100: Heat dissipation device
101: Heat generating unit
102: Base structure
103: Close-loop shunting heat conductive structure
104: Distal heat dissipating segment
105: Inner heat dissipation surface
106: Outer heat dissipation surface
107: Radial airflow aperture
110: Annularly-arranged axial airflow aperture
111: Light emitting diode
112: Secondary optical device
113: Light pervious lamp cover
114: Fastening and electric conducting interface
115: Drive circuit device
116: Conductive wire
1000: Heat dissipation device having U-shaped structure
1021: Annularly-arranged heat generating unit
1022: Central airflow aperture
1023, 1052: Airflow aperture
2000: Heat dissipation device having tubular structure
a: Central location of the base structure (102) close to the heat generating unit (101)
b: Outer location of the base structure (102) close to the heat generating unit (101)
c: Combining location of the distal heat dissipating segment (104) and the close-loop shunting heat conductive structure (103)
d: Distal location of the distal heat dissipating segment (104)

e: Distal location of the close-loop shunting heat conductive structure (103)

DETAILED DESCRIPTION OF THE PREFERRED EMBODIMENTS

A conventional semiconductor having heat loss, e.g. a light emitting diode (LED), central process unit (CPU), memory, power semiconductor, rectifier, or power-type IC in which heat loss being generated, or an active heat generating unit, e.g. a heater, oven or cooking ware operated through electric power or thermal combustion, the heat source is often installed at the bottom central area of a heat dissipation device, and through a heat conductive structure radially and outwardly extending and upwardly extending, the heat can be conducted to a distal heat dissipation structure thereby dissipating the heat to the exterior; because the lateral edge area of the heat generating unit is closer to the heat conductive structure radially and outwardly extending and upwardly extending, while the central area of the heat generating unit is relatively farer, the temperature at the central area of the heat generating unit is higher than the temperature at the peripheral area during operation, thereby causing an disadvantage of the temperature between the central area and the lateral edge of the heat generating unit being uneven.

The present invention provides a heat dissipation device having lateral-spreading heat dissipating and shunting heat conductive structure, in which the top central area or the bottom central area of heat conductive interface of the heat dissipation device (100) where a heat generating unit (101) being provided is installed with be heat generating unit (101), the central area of heat conductive interface of the mentioned heat dissipation device (100) is installed with a close-loop shunting heat conductive structure, so the heat at the periphery of the heat generating unit (101) can be conducted from the outer periphery to the distal heat dissipating segment (104) for being dissipated to the exterior, and the heat at the central area can be conducted through the close-loop shunting heat conductive structure (103) to the distal heat dissipating segment (104) for being dissipated to the exterior;

The present invention provides a heat dissipation device having lateral-spreading heat dissipating and shunting heat conductive structure, in which the central area of heat conductive interface of the heat dissipation device (100) where a heat generating unit being disposed is installed with a close-loop shunting heat conductive structure, so the heat at the central area of the heat generating unit (101) can be conducted to a distal heat dissipating segment (104) for being dissipated to the exterior, thereby through working with the heat dissipation operation of the heat dissipation structure at the periphery of the heat generating unit (101) and leaded to the distal heat dissipating segment (104), the temperature distribution at the central area and the peripheral area of the heat generating unit (101) can be more even.

FIG. 1 is a temperature distribution diagram illustrating the bottom central area of a base structure (102) of a conventional heat dissipation device (100) outwardly expanded towards single side being installed with a heat generating unit (101);

As shown in FIG. 1, the heat generating unit (101) is installed in the base structure (102) of the heat dissipation device (100), and the base structure (102) is disposed at the lateral bottom side (or top side) of the heat dissipation device (100), when heat is generated by the heat generating unit (101) and is dissipated to the exterior through a distal heat dissipating segment (104) of the heat dissipation device (100), the temperature at the central location (a) of the base structure (102) close to the heat generating unit (101)>the temperature at the outer location (b) of the base structure (102) close to the heat generating unit (101)>the temperature at the distal location (d) of the distal heat dissipating segment (104).

Figure 2:
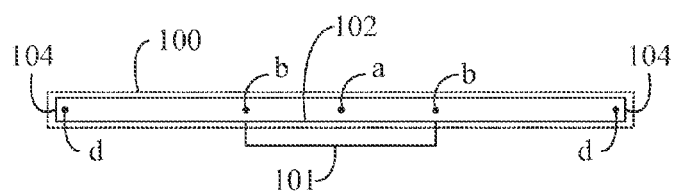
FIG. 2 is a temperature distribution diagram illustrating the bottom central area of a base structure (102) of a conventional heat dissipation device (100) expanded outwardly to the periphery being installed with a heat generating unit (101).

FIG. 2 is a temperature distribution diagram illustrating the bottom central area of a base structure (102) of a conventional heat dissipation device (100) expanded outwardly to the periphery being installed with a heat generating unit (101);

As shown in FIG. 2, the heat generating unit (101) is installed in the base structure (102) of the heat dissipation device (100), and the base structure (102) is disposed at the central bottom side (or top side) of the heat dissipation device (100), when heat is generated by the heat generating unit (101) and is dissipated to the exterior through the distal heat dissipating segments (104) at two sides of the heat dissipation device (100), the temperature at the central location (a) of the base structure (102) close to the heat generating unit (101)>the temperature at the outer location (b) of the base structure (102) at two sides close to the heat generating unit (101)>the temperature at the distal location (d) of the distal heat dissipating segment (104) at two sides.

Figure 3:
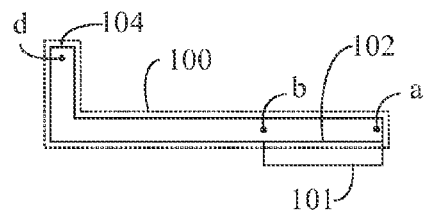
FIG. 3 is a temperature distribution diagram illustrating the conventional heat dissipation device (100) being installed with a distal heat dissipating unit (104) expanded towards single side and upwardly extended, and the bottom central area of the base structure (102) of the heat dissipation device (100) being installed with the heat generating unit (101).

FIG. 3 is a temperature distribution diagram illustrating the conventional heat dissipation device (100) being installed with a distal heat dissipating unit (104) expanded towards single side and upwardly extended, and the bottom central area of the base structure (102) of the heat dissipation device (100) being installed with the heat generating unit (101);

As shown in FIG. 3, the heat dissipation device (100) is installed with the distal heat dissipating unit (104) expanded towards single side and upwardly extended, and the heat generating unit (101) is installed at the central bottom side (or top side) of the base structure (102), so when heat is generated by the heat generating unit (101) and is dissipated to the exterior through a distal heat dissipating segment (104) of the heat dissipation device (100), the temperature at the central location (a) of the base structure (102) close to the heat generating unit (101)>the temperature at the outer location (b) of the base structure (102) close to the heat generating unit (101)>the temperature at the distal location (d) of the distal heat dissipating segment (104).

Figure 4:
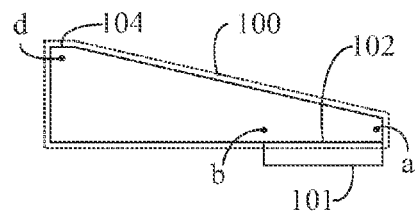
FIG. 4 is a temperature distribution diagram illustrating the base structure (102) of the conventional heat dissipation device (100) installed with the distal heat dissipating unit (104) expanded towards single side and upwardly extended, the heat conductive area being gradually enlarged towards the distal heat dissipating segment (104), and the bottom central area being installed with the heat generating unit (101).

FIG. 4 is a temperature distribution diagram illustrating the base structure (102) of the conventional heat dissipation device (100) installed with the distal heat dissipating unit (104) expanded towards single side and upwardly extended, the heat conductive area being gradually enlarged towards the distal heat dissipating segment (104), and the bottom central area being installed with the heat generating unit (101);

As shown in FIG. 4, the heat dissipation device (100) is installed with the base structure (102) of the heat dissipation device (100) having the distal heat dissipating unit (104) expanded towards single side and upwardly extended, the heat conductive area is gradually enlarged towards the distal heat dissipating segment (104), and the heat generating unit (101) is installed at the central bottom side, so when heat is generated by the heat generating unit (101) and is dissipated to the exterior through a distal heat dissipating segment (104) of the heat dissipation device (100), the temperature at the central location (a) of the base structure (102) close to the heat generating unit (101)>the temperature at the outer location (b) of the base structure (102) close to the heat generating unit (101)>the temperature at the distal location (d) of the distal heat dissipating segment (104).

Figure 5:
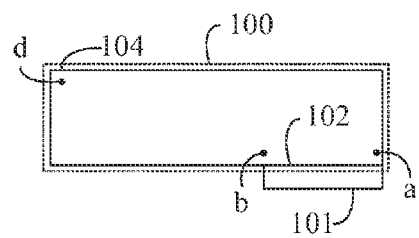
FIG. 5 is a temperature distribution diagram illustrating a heat generating unit (101) being installed at the bottom central area of the base structure (102) of the heat dissipation device (100) having greater thickness and outwardly expanded towards single side.

FIG. 5 is a temperature distribution diagram illustrating a heat generating unit (101) being installed at the bottom central area of the base structure (102) of the heat dissipation device (100) having greater thickness and outwardly expanded towards single side;

As shown in FIG. 5, the heat dissipation device (100) is a heat dissipation device (100) having greater thickness and outwardly expanded towards single side, the heat generating unit (101) is installed at the central bottom are of the base structure (102) of the heat dissipation device (100), when heat is generated by the heat generating unit (101) and is dissipated to the exterior through a distal heat dissipating segment (104) of the heat dissipation device (100), the temperature at the central location (a) of the base structure (102) close to the heat generating unit (101)>the temperature at the outer location (b) of the base structure (102) close to the heat generating unit (101)>the temperature at the distal location (d) of the distal heat dissipating segment (104).

Figure 6:
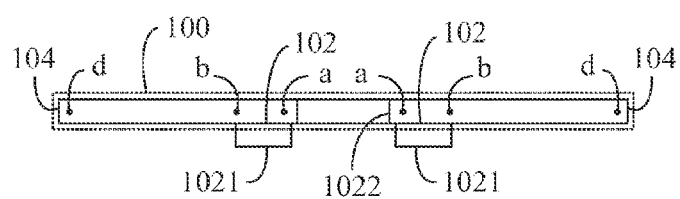
FIG. 6 is a temperature distribution diagram illustrating the center of the conventional heat dissipation device (100) being formed with a central airflow aperture (1022), the base structure (102) at the periphery of the central airflow aperture (1022) being annularly arranged with heat generating units (1021).

FIG. 6 is a temperature distribution diagram illustrating the center of the conventional heat dissipation device (100) being formed with a central airflow aperture (1022), the base structure (102) at the periphery of the central airflow aperture (1022) being annularly arranged with heat generating units (1021);

As shown in FIG. 6, the center of the heat dissipation device (100) is formed with one or more central airflow apertures (1022), the base structure (102) at the periphery of the central airflow aperture (1022) is annularly arranged with the heat generating units (1021), when heat is generated by the heat generating units (1021) and is dissipated to the exterior through a distal heat dissipating segment (104) of the heat dissipation device (100), the temperature at the central location (a) of the base structure (102) close to the heat generating unit (101)>the temperature at the outer location (b) of the base structure (102) close to the heat generating unit (101)>the temperature at the distal location (d) of the distal heat dissipating segment (104).

Figure 7:
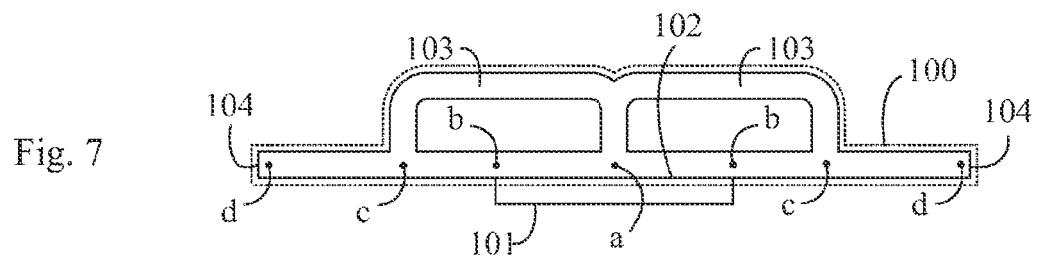
FIG. 7 is a cross sectional view illustrating the close-loop shunting heat conductive structure (103) being installed between the central area of the base structure (102) of the heat dissipation device (100) and the combining location (c) of the outwardly expanding distal heat dissipating segment (104) and the close-loop shunting heat conductive structure (103), according to one embodiment of the present invention.

According to the heat dissipation device having lateral-spreading heat dissipating and shunting heat conductive structure provided by the present invention, for reducing the temperature differentiation between the central location (a) of the base structure (102) close to the heat generating unit (101) and the outer location (b) of the base structure (102) close to the heat generating unit (101) of the heat generating unit (101) installed on the base structure (102) of the mentioned heat dissipation device (100), or a heat generating unit (1021) installed at the periphery of a central airflow aperture (1022), the present invention provides a novel close-loop shunting heat conductive structure (103) between the central location (a) of the base structure (102) close to the heat generating unit (101) and the combining location (c) of the distal heat dissipating segment (104) and the close-loop shunting heat conductive structure (103) for lowering the temperature differentiation between the central location (a) of the base structure (102) close to the heat generating unit (101) and the outer location (b) of the base structure (102) close to the heat generating unit (101); according to the heat dissipation device having lateral-spreading heat dissipating and shunting heat conductive structure provided by the present invention, the heat dissipation device (100) is composed of a heat conductive material, e.g. aluminum, copper, alloy or ceramic material, and is formed with a structure having plate-like shape or disc-like shape, column-like circular column, or polygonal, or U-shaped plate, or formed with a circular cup-like shape, or polygonal cup-like shape, or a cup-shaped structure having fork shape at the outer periphery; the center of the heat dissipation device (100) is installed with the heat generating unit (101), and the close-loop shunting heat conductive structure (103) is installed between the central location (a) of the base structure (102) close to the heat generating unit (101) and the combining location (c) of the distal heat dissipating segment (104) and the close-loop shunting heat conductive structure (103), thereby facilitating the conduction between the central location (a) of the base structure (102) close to the heat generating unit (101) and the combining location (c) of the distal heat dissipating segment (104) and the close-loop shunting heat conductive structure (103); embodiments provided are as followings:

FIG. 7 is a cross sectional view illustrating the close-loop shunting heat conductive structure (103) being installed between the central area of the base structure (102) of the heat dissipation device (100) and the combining location (c) of the outwardly expanding distal heat dissipating segment (104) and the close-loop shunting heat conductive structure (103), according to one embodiment of the present invention;

As shown in FIG. 7, it mainly consists of:

heat dissipation device (100): composed of a heat conductive material, e.g. aluminum, copper, alloy or ceramic material, formed in a plate-like shape, or disc-like shape or polygonal shape, the base structure (102) at the center is installed with the heat generating unit (101);

heat generating unit (101): composed of a lamp having heat loss and emitting light through being electrically charge for being installed in the base structure (102), or composed of an electrically-charged heating member or a heat conductive material receiving external heat for being combined with the base structure (102) or directly supplying heat to the base structure (102);

close-loop shunting heat conductive structure (103): composed of a heat conductive material, integrally formed with the heat dissipation device (100), or composed of the same or different material with respect to the heat dissipation device (100), and combined or welded between the central location (a) of the base structure (102) close to the heat generating unit (101) and the combining location (c) of the distal heat dissipating segment (104) and the close-loop shunting heat conductive structure (103).

Figure 8:
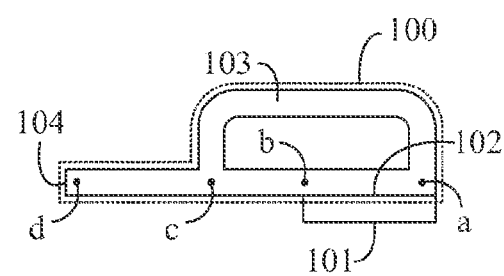
FIG. 8 is a cross sectional view illustrating the heat generating unit (101) being installed in the base structure (102) at one bottom lateral side of the heat dissipation device (100) and a close-loop shunting heat conductive structure (103) being installed between one side of the base structure (102) away from the distal heat dissipating segment (104) and the combining location (c) of the distal heat dissipating segment (104) and the close-loop shunting heat conductive structure (103), according to one embodiment of the present invention.

FIG. 8 is a cross sectional view illustrating the heat generating unit (101) being installed in the base structure (102) at one bottom lateral side of the heat dissipation device (100) and a close-loop shunting heat conductive structure (103) being installed between one side of the base structure (102) away from the distal heat dissipating segment (104) and the combining location (c) of the distal heat dissipating segment (104) and the close-loop shunting heat conductive structure (103), according to one embodiment of the present invention;

As shown in FIG. 8, the main configuration is that the heat generating unit (101) is installed in the base structure (102) at one bottom lateral side of the heat dissipation device (100), and the close-loop shunting heat conductive structure (103) is installed between one side of the base structure (102) away from the distal heat dissipating segment (104) and the combining location (c) of the distal heat dissipating segment (104) and the close-loop shunting heat conductive structure (103).

Figure 9:
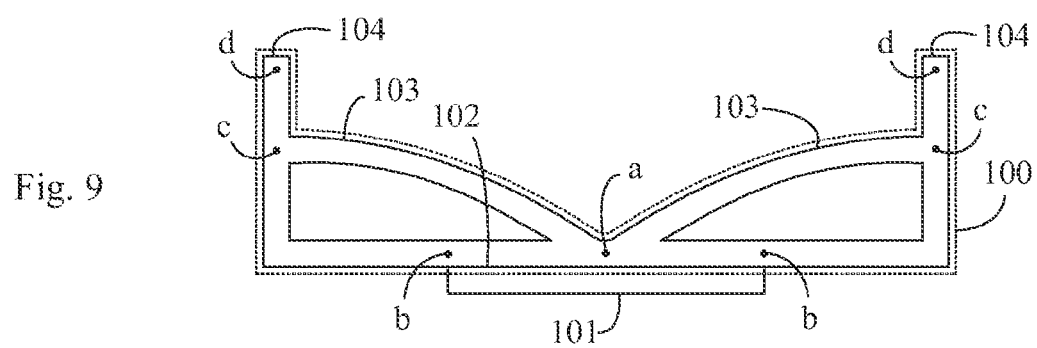
FIG. 9 is a cross sectional view illustrating the close-loop shunting heat conductive structure (103) being installed between the central area of the base structure (102) of the heat dissipation device (100) and the combining location (c) of the horizontally expanding and upwardly extending distal heat dissipating segment (104) and the close-loop shunting heat conductive structure (103), according to one embodiment of the present invention.

FIG. 9 is a cross sectional view illustrating the close-loop shunting heat conductive structure (103) being installed between the central area of the base structure (102) of the heat dissipation device (100) and the combining location (c) of the horizontally expanding and upwardly extending distal heat dissipating segment (104) and the close-loop shunting heat conductive structure (103), according to one embodiment of the present invention;

As shown in FIG. 9, it mainly consists of:

heat dissipation device (100): composed of a heat conductive material, e.g. aluminum, copper, alloy or ceramic material, formed in a U-shaped plate shape, circular cup-like shape or polygonal cup-like shape, or formed in a fork-like cup-shaped structure having upward heat dissipating fork at the outer side, the center of the heat dissipation device (100) is installed with the heat generating unit (101), and the close-loop shunting heat conductive structure (103) is installed between the central location (a) of the base structure (102) close to the heat generating unit (101) and the combining locations (c) of the distal heat dissipating segment (104) and the close-loop shunting heat conductive structure (103), thereby reducing the temperature differentiation between the central location (a) of the base structure (102) close to the heat generating unit (101) and the distal location (d) of the distal heat dissipating segment (104);

heat generating unit (101): composed of a lamp having heat loss and emitting light through being electrically charge for being installed in the base structure (102), or composed of an electrically-charged heating member or a heat conductive material receiving external heat for being combined with the base structure (102) or directly supplying heat to the base structure (102);

close-loop shunting heat conductive structure (103): composed of a heat conductive material, integrally formed with the heat dissipation device (100), or composed of the same or different material with respect to the heat dissipation device (100), and combined or welded between the central location (a) of the base structure (102) close to the heat generating unit (101) and the combining locations (c) of the distal heat dissipating segment (104) and the close-loop shunting heat conductive structure (103).

Figure 10:
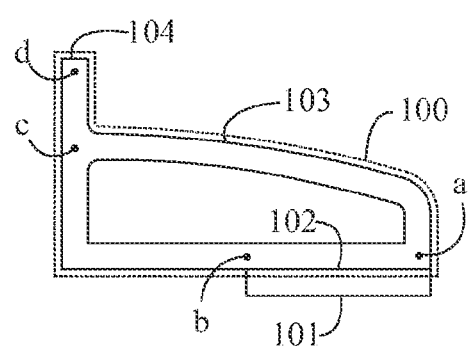
FIG. 10 is a cross sectional view illustrating the heat generating unit (101) being installed in the base structure (102) at one bottom lateral side of the heat dissipation device (100) and a close-loop shunting heat conductive structure (103) being installed between one side of the base structure (102) away from the distal heat dissipating segment (104) and the combining location (c) of the upwardly extending distal heat dissipating segment (104) and the close-loop shunting heat conductive structure (103), according to one embodiment of the present invention.

FIG. 10 is a cross sectional view illustrating the heat generating unit (101) being installed in the base structure (102) at one bottom lateral side of the heat dissipation device (100) and a close-loop shunting heat conductive structure (103) being installed between one side of the base structure (102) away from the distal heat dissipating segment (104) and the combining location (c) of the upwardly extending distal heat dissipating segment (104) and the close-loop shunting heat conductive structure (103), according to one embodiment of the present invention;

As shown in FIG. 10, the main configuration is that the heat generating unit (101) is installed in the base structure (102) at one bottom lateral side of the heat dissipation device (100), and the close-loop shunting heat conductive structure (103) is installed between one side of the base structure (102) away from the distal heat dissipating segment (104) and the combining location (c) of the upwardly extending distal heat dissipating segment (104) and the close-loop shunting heat conductive structure (103).

Figure 11:
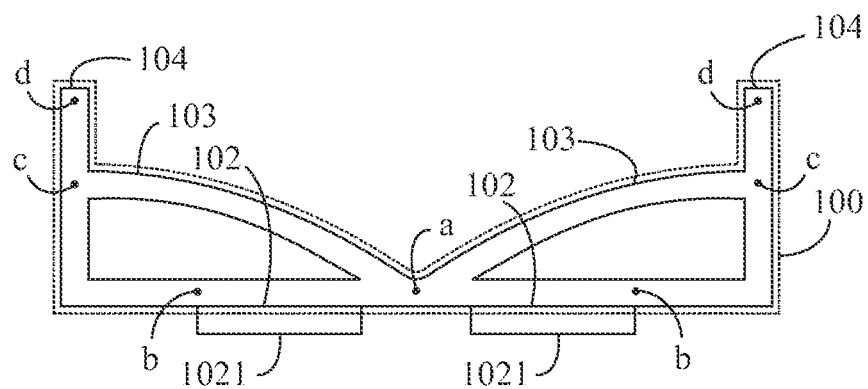
FIG. 11 is a cross sectional view illustrating two or more heat generating units (1021) being annularly arranged in the heat dissipation device (100) shown in FIG. 9, according to one embodiment of the present invention.

FIG. 11 is a cross sectional view illustrating two or more heat generating units (1021) being annularly arranged in the heat dissipation device (100) shown in FIG. 9, according to one embodiment of the present invention;

As shown in FIG. 11, it mainly consists of:

heat dissipation device (100): composed of a heat conductive material, e.g. aluminum, copper, alloy or ceramic material, formed in a U-shaped plate-like shape, circular cup-like shape or polygonal cup-like shape, or formed in a fork-like cup-shaped structure having upward heat dissipating fork at the outer side, the center of the heat dissipation device (100) is installed with the heat generating unit (101), and the close-loop shunting heat conductive structure (103) is installed between the central location (a) of the base structure (102) close to the heat generating unit (101) and the distal location (d) of the distal heat dissipating segment (104), thereby reducing the temperature differentiation between the central location (a) of the base structure (102) close to the heat generating unit (101) and the distal location (d) of the distal heat dissipating segment (104);

heat generating unit (1021): constituted by annularly-arranged heat generating units (1021) composed of two or more lamps having heat loss and emitting light through being electrically charge for being installed in the base structure (102), or composed of an electrically-charged heating member or a heat conductive material receiving external heat for being combined with the base structure (102) or directly supplying heat to the base structure (102);

close-loop shunting heat conductive structure (103): composed of a heat conductive material, integrally formed with the heat dissipation device (100), or composed of the same or different material with respect to the heat dissipation device (100), and combined or welded between the central location (a) of the base structure (102) close to the heat generating unit (101) and the combining location (c) of the distal heat dissipating segment (104) and the close-loop shunting heat conductive structure (103).

Figure 12:
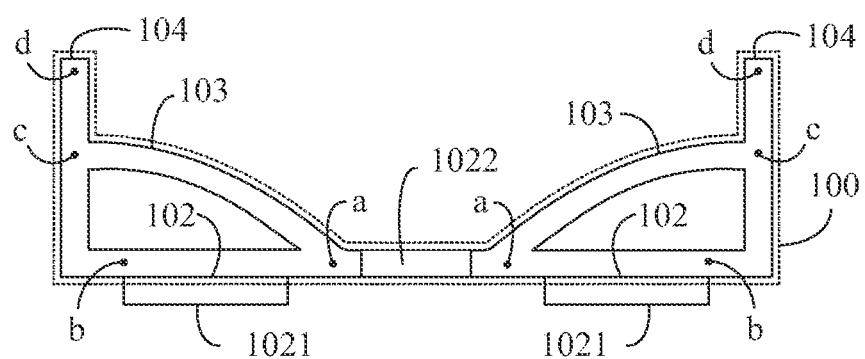
FIG. 12 is a cross sectional view illustrating the central airflow aperture (1022) and two or more annularly arranged heat generating units (1021) being installed in the heat dissipation device (100) shown in FIG. 9, according to one embodiment of the present invention.

FIG. 12 is a cross sectional view illustrating the central airflow aperture (1022) and two or more annularly arranged heat generating units (1021) being installed in the heat dissipation device (100) shown in FIG. 9, according to one embodiment of the present invention;

As shown in FIG. 12, it mainly consists of:

heat dissipation device (100): composed of a heat conductive material, e.g. aluminum, copper, alloy or ceramic material, formed in a U-shaped plate-like shape, circular cup-like shape or polygonal cup-like shape, or formed in a fork-like cup-shaped structure having upward heat dissipating fork at the outer side, the heat dissipation device (100) is formed with the central airflow aperture (1022) and two or more heat generating units (1021) annularly arranged at the periphery of the central airflow aperture (1022), the central airflow aperture (1022) is formed as a single aperture or plural aperture structure, the plural aperture structure include plural individual apertures or net-like apertures or grid-like apertures, the center of the heat dissipation device (100) is installed with the heat generating unit (101), and the close-loop shunting heat conductive structure (103) is installed between the central location (a) of the base structure (102) close to the heat generating unit (101) and the combining location (c) of the distal heat dissipating segment (104) and the close-loop shunting heat conductive structure (103), thereby reducing the temperature differentiation between the central location (a) of the base structure (102) close to the heat generating unit (1021) and the combining location (c) of the distal heat dissipating segment (104) and the close-loop shunting heat conductive structure (103);

heat generating unit (1021): constituted by annularly-arranged heat generating units (1021) composed of two or more lamps having heat loss and emitting light through being electrically charge for being installed in the base structure (102), or composed of an electrically-charged heating member or a heat conductive material receiving external heat for being combined with the base structure (102) or directly supplying heat to the base structure (102);

close-loop shunting heat conductive structure (103): composed of a heat conductive material, integrally formed with the heat dissipation device (100), or composed of the same or different material with respect to the heat dissipation device (100), and combined or welded between the central locations (a) of the base structure (102) close to the heat generating units (1021) at the periphery of the central airflow aperture (1022) and the combining location (c) of the distal heat dissipating segment (104) and the close-loop shunting heat conductive structure (103).

Figure 13:
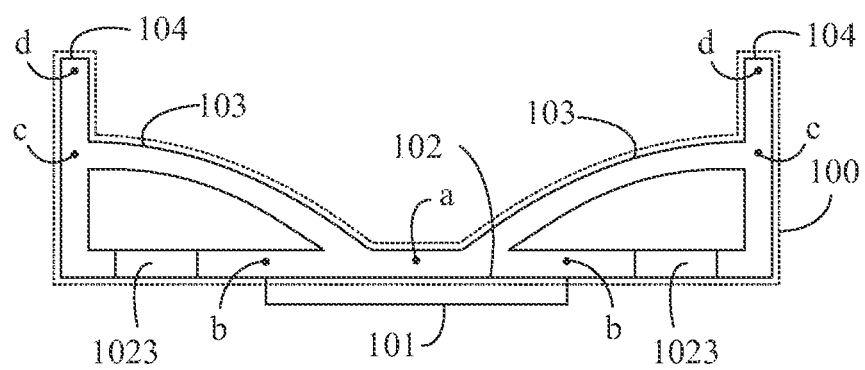
FIG. 13 is a cross sectional view illustrating two or more airflow apertures (1023) being formed at the periphery expanded from the central area of the base structure (102) of the heat dissipation device (100) shown in FIG. 9, according to one embodiment of the present invention.

FIG. 13 is a cross sectional view illustrating two or more airflow apertures (1023) being formed at the periphery expanded from the central area of the base structure (102) of the heat dissipation device (100) shown in FIG. 9, according to one embodiment of the present invention;

As shown in FIG. 13, it mainly consists of:

heat dissipation device (100): composed of a heat conductive material, e.g. aluminum, copper, alloy or ceramic material, formed in a U-shaped plate-like shape, circular cup-like shape or polygonal cup-like shape, or formed in a fork-like cup-shaped structure having upward heat dissipating fork at the outer side, two or more airflow apertures (1023) are formed at the periphery expanded from the central area of the base structure (102), which is installed with the heat generating unit (101), of the heat dissipation device (100), the airflow apertures (1023) are formed as plural individual apertures or a structure having net-like apertures or grid-like aperture, the center of the heat dissipation device (100) is installed with the heat generating unit (101), and the close-loop shunting heat conductive structure (103) is installed between the central location (a) of the base structure (102) close to the heat generating unit (101) and the distal location (d) of the distal heat dissipating segment (104), thereby reducing the temperature differentiation between the central location (a) of the base structure (102) close to the heat generating unit (101) and the distal location (d) of the distal heat dissipating segment (104);

heat generating unit (101): composed of a lamp having heat loss and emitting light through being electrically charge for being installed in the base structure (102), or composed of an electrically-charged heating member or a heat conductive material receiving external heat for being combined with the base structure (102) or directly supplying heat to the base structure (102);

close-loop shunting heat conductive structure (103): composed of a heat conductive material, integrally formed with the heat dissipation device (100), or composed of the same or different material with respect to the heat dissipation device (100), and combined or welded between the central location (a) of the base structure (102) close to the heat generating unit (101) and the combining location (c) of the distal heat dissipating segment (104) and the close-loop shunting heat conductive structure (103).

Figure 14:
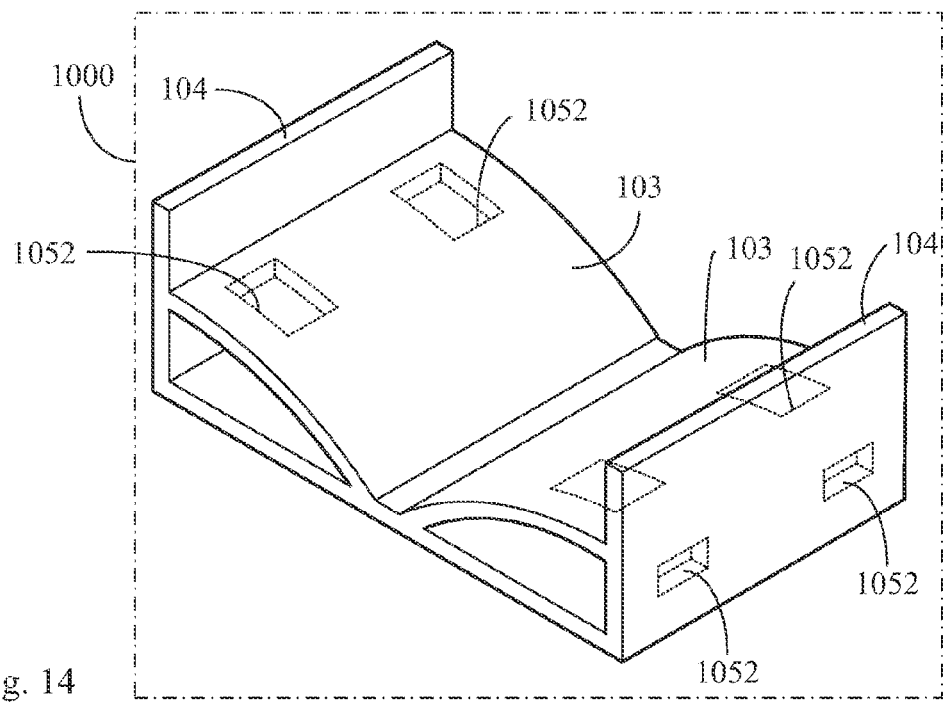
FIG. 14 is a schematic structural view illustrating the present invention being formed as a heat dissipation device having U-shaped structure (1000), wherein the close-loop shunting heat conductive structure (103) and/or the distal heat dissipating segment (104) being formed with airflow apertures (1052), according to one embodiment of the present invention.
Figure 15:
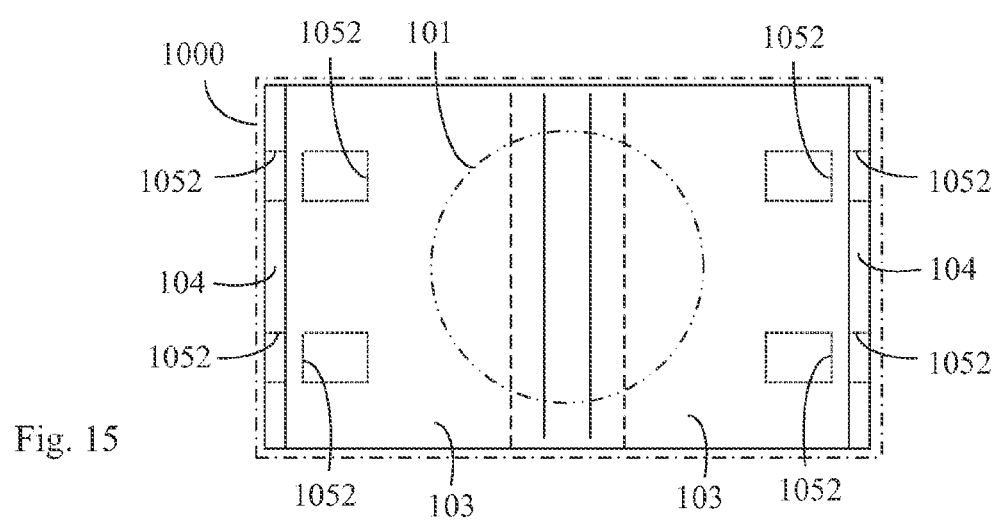
FIG. 15 is a top view of FIG. 14.
Figure 16:
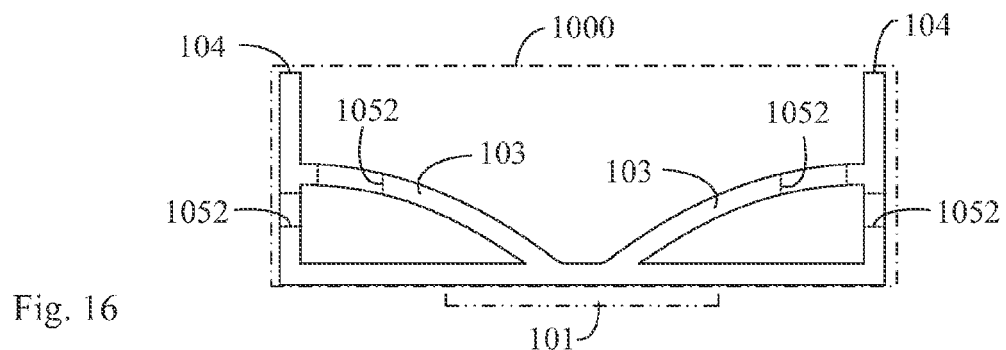
FIG. 16 is a lateral view of FIG. 14.

FIG. 14 is a schematic structural view illustrating the present invention being formed as a heat dissipation device having U-shaped structure (1000), wherein the close-loop shunting heat conductive structure (103) and/or the distal heat dissipating segment (104) being formed with airflow apertures (1052), according to one embodiment of the present invention;

FIG. 15 is a top view of FIG. 14;

FIG. 16 is a lateral view of FIG. 14;

As shown in FIG. 14, FIG. 15 and FIG. 16, the main configuration is that the heat dissipation device having U-shaped structure (1000) disclosed in FIG. 13 is adopted as a foundation, the characteristic is that the close-loop shunting heat conductive structure (103) and/or the distal heat dissipating segment (104) is further formed with the airflow apertures (1052), and the airflow apertures (1052) can be formed as plural individual apertures, or a structure having net-like or grid-like apertures, the top edge of the distal heat dissipating segment (104) can be formed with a multiple-surface or annular or tooth-like crown or fork-like structure, and the surface thereof includes planar or grid-like shape or a structure with the heat dissipation fin.

Figure 17:
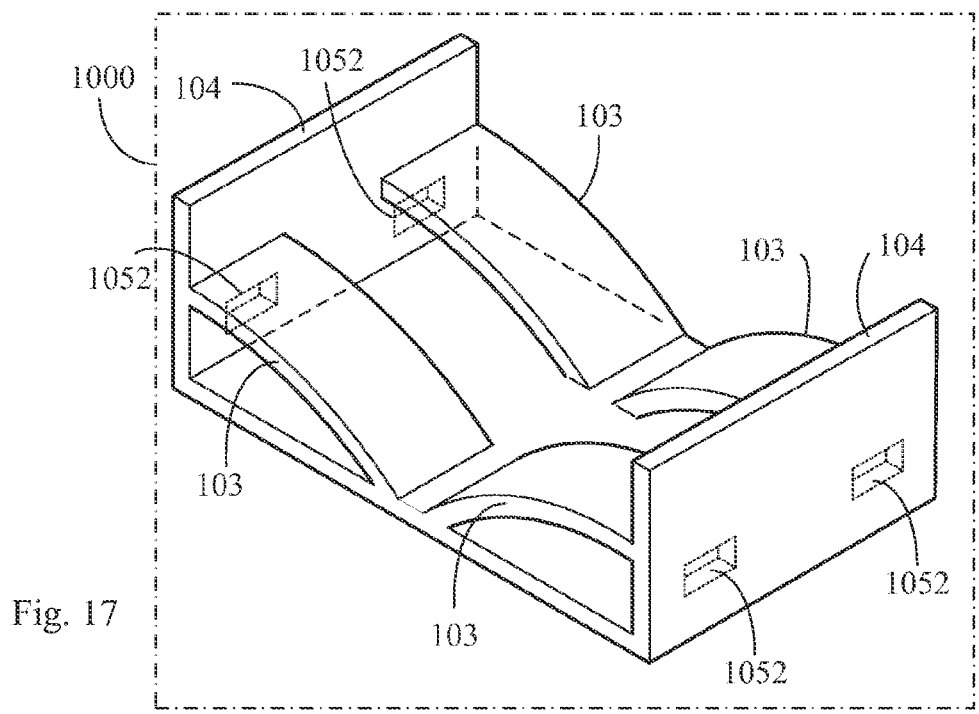
FIG. 17 is a schematic structural view illustrating the present invention being formed as a heat dissipation device having U-shaped structure (1000), wherein the close-loop shunting heat conductive structure (103) and/or the distal heat dissipating segment (104) being formed with a radial grid heat dissipation space, according to one embodiment of the present invention.
Figure 18:
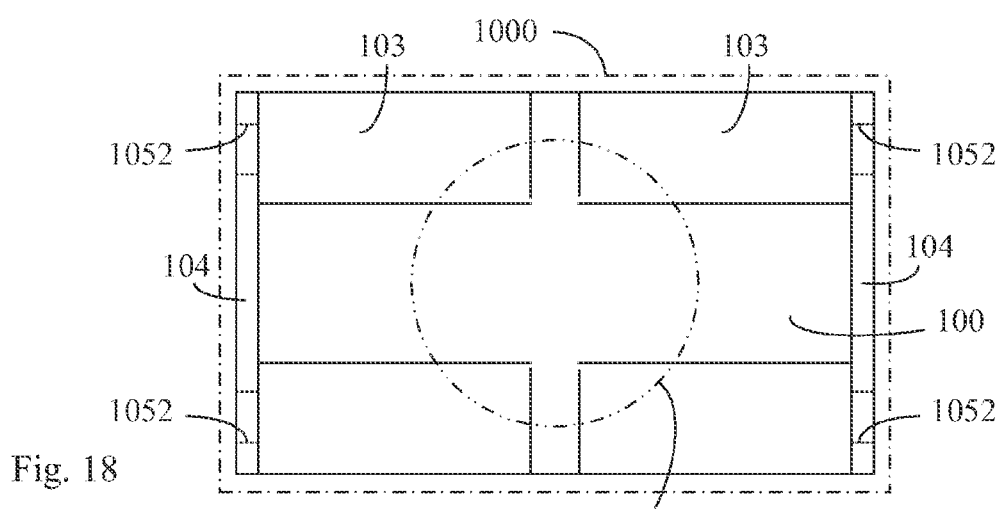
FIG. 18 is a top view of FIG. 17.
Figure 19:
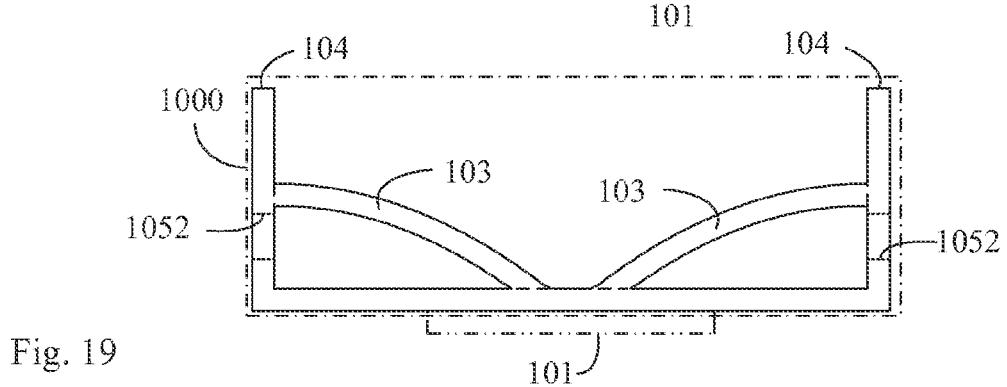
FIG. 19 is a lateral view of FIG. 17.

FIG. 17 is a schematic structural view illustrating the present invention being formed as a heat dissipation device having U-shaped structure (1000), wherein the close-loop shunting heat conductive structure (103) and/or the distal heat dissipating segment (104) being formed with a radial grid heat dissipation space, according to one embodiment of the present invention;

FIG. 18 is a top view of FIG. 17;

FIG. 19 is a lateral view of FIG. 17;

As shown in FIG. 17, FIG. 18 and FIG. 19, the main configuration is that the heat dissipation device having U-shaped structure (1000) disclosed in FIG. 13 is adopted as a foundation, the characteristic is that the close-loop shunting heat conductive structure (103) and/or the distal heat dissipating segment (104) is further formed with the radial grid heat dissipation space, the top edge of the distal heat dissipating segment (104) can be formed with a multiple-surface or annular or tooth-like crown or fork-like structure, and the surface thereof includes planar or grid-like shape or a structure with the heat dissipation fin.

Figure 20:
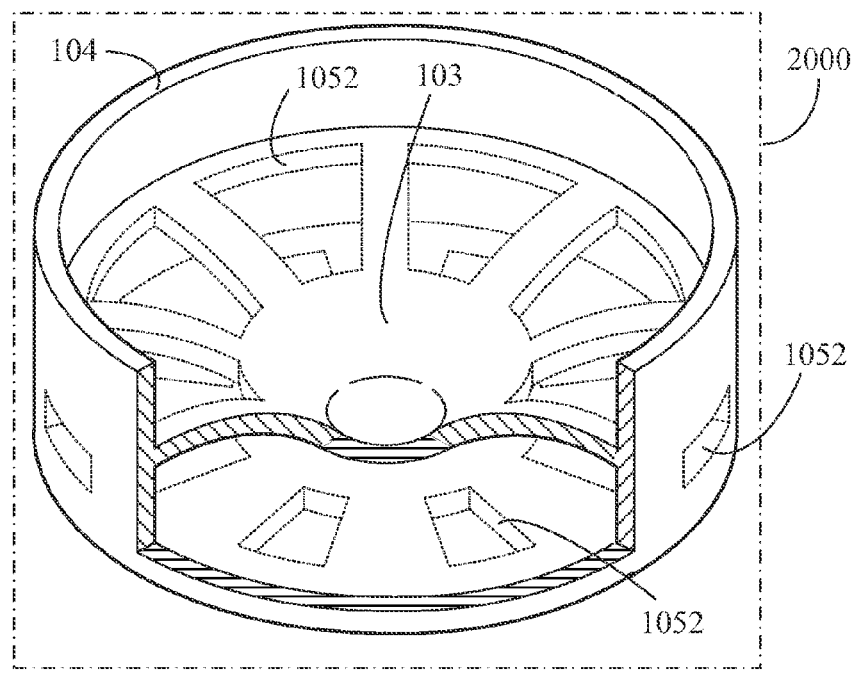
FIG. 20 is a schematic structural view illustrating the present invention being formed as a heat dissipation device having tubular structure (2000), wherein the periphery of the close-loop shunting heat conductive structure (103) and/or the distal heat dissipating segment (104) and/or the heat dissipation device having tubular structure (2000) being formed with airflow apertures (1052), according to one embodiment of the present invention.
Figure 21:
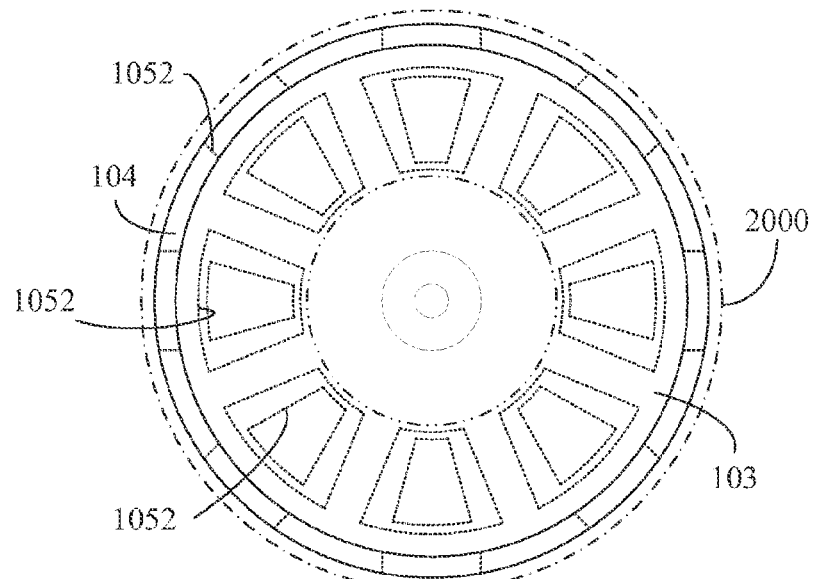
FIG. 21 is a top view of FIG. 20.
Figure 22:
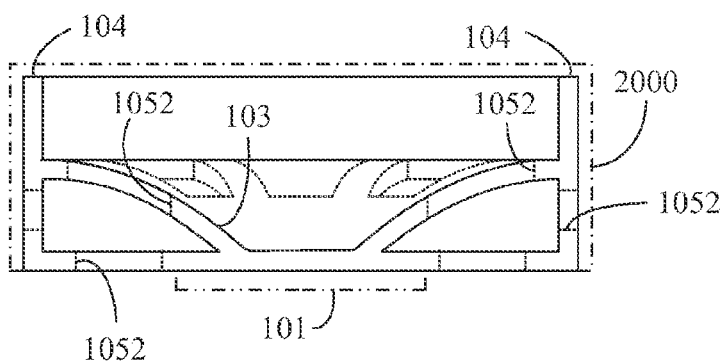
FIG. 22 is a lateral view of FIG. 20.

FIG. 20 is a schematic structural view illustrating the present invention being formed as a heat dissipation device having tubular structure (2000), wherein the periphery of the close-loop shunting heat conductive structure (103) and/or the distal heat dissipating segment (104) and/or the heat dissipation device having tubular structure (2000) being formed with airflow apertures (1052), according to one embodiment of the present invention;

FIG. 21 is a top view of FIG. 20;

FIG. 22 is a lateral view of FIG. 20;

As shown in FIG. 20, FIG. 21 and FIG. 22, the main configuration is that the heat dissipation device having tubular structure (2000) is adopted as a foundation, wherein the heat dissipation device having tubular structure (2000) is composed of a heat conductive material and formed in a tubular shape, the top thereof is formed as an opened or sealed or semi-sealed structure, the bottom thereof is formed as a round plate-like structure, the periphery of the heat dissipation device having tubular structure (2000) is combined with the distal heat dissipating segment (104) composed of an annularly upwardly-extended structure formed in planar or grid-like shape or a surface with the heat dissipation fin, and radially-arranged airflow apertures (1052) are formed on the central area of the distal heat dissipating segment (104) facing the distal end of the distal heat dissipating segment (104), and/or the heat conductive structural surface formed on the close-loop shunting heat conductive structure (103) outwardly expanded towards the distal heat dissipating segment (104), and/or the heat conductive surface formed on the heat dissipation device having tubular structure (2000) outwardly expanded towards the periphery, and the bottom central area of the heat dissipation device having tubular structure (2000) is installed with the heat generating unit (101).

Figure 23:
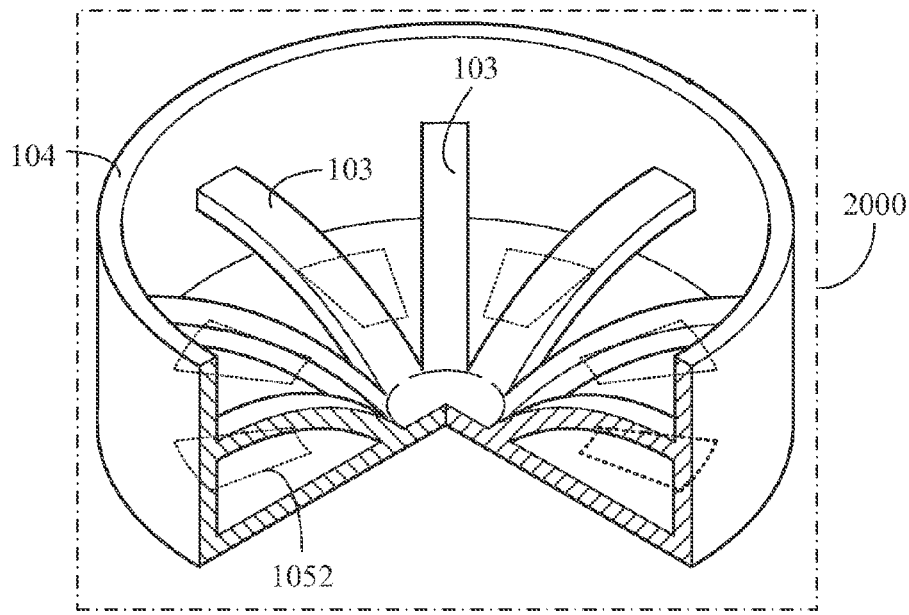
FIG. 23 is a schematic structural view illustrating the present invention being formed as a heat dissipation device having tubular structure (2000), wherein the close-loop shunting heat conductive structure (103) and/or the distal heat dissipating segment (104) being formed with the radial grid heat dissipation space, according to one embodiment of the present invention.
Figure 24:
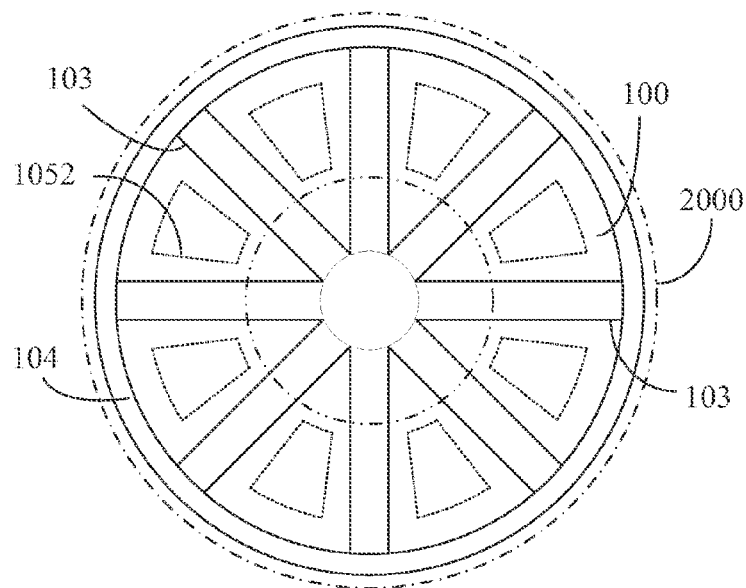
FIG. 24 is a top view of FIG. 23.
Figure 25:
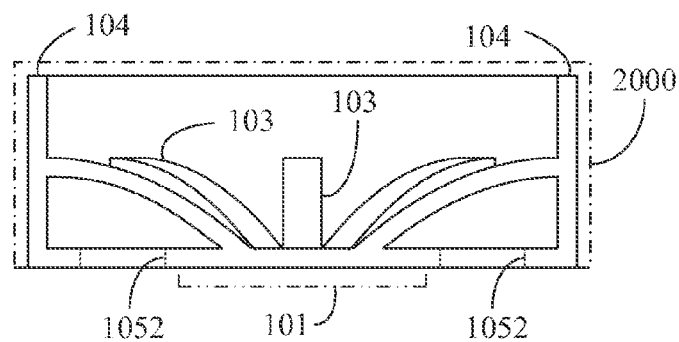
FIG. 25 is a lateral view of FIG. 23.

FIG. 23 is a schematic structural view illustrating the present invention being formed as a heat dissipation device having tubular structure (2000), wherein the close-loop shunting heat conductive structure (103) and/or the distal heat dissipating segment (104) being formed with the radial grid heat dissipation space, according to one embodiment of the present invention;

FIG. 24 is a top view of FIG. 23;

FIG. 25 is a lateral view of FIG. 23;

As shown in FIG. 23, FIG. 24 and FIG. 25, the main configuration is that the heat dissipation device having tubular structure (2000) is adopted as a foundation, wherein the heat dissipation device having tubular structure (2000) is composed of a heat conductive material and formed in a tubular shape, the top thereof is formed as an opened or sealed or semi-sealed structure, the bottom thereof is formed as a round plate shaped heat dissipation device (100), the periphery of the heat dissipation device having tubular structure (2000) is combined with the distal heat dissipating segment (104) composed of an annularly upwardly-extended structure formed in planar or grid-like shape or a surface with the heat dissipation fin, and radially-arranged airflow apertures (1052) are formed on the heat conductive structural surface formed on the close-loop shunting heat conductive structure (103) outwardly expanded towards the distal heat dissipating segment (104), and/or the heat conductive surface formed on the heat dissipation device having tubular structure (2000) outwardly expanded toward the periphery, and the bottom central area of the heat dissipation device having tubular structure (2000) is installed with the heat generating unit (101).

Figure 26:
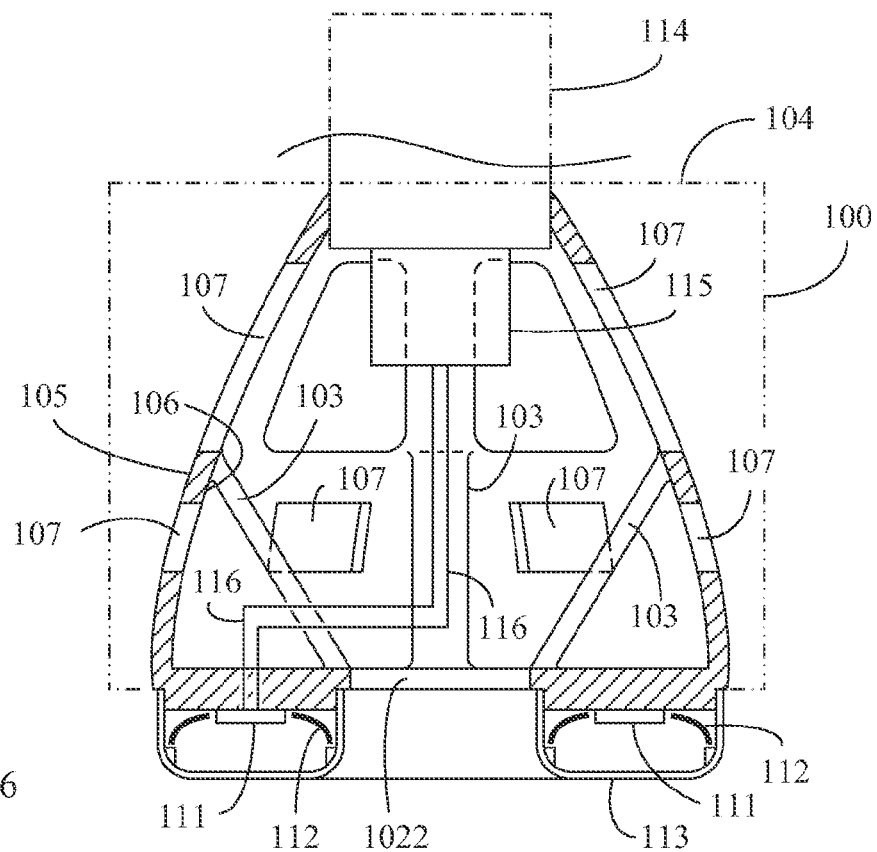
FIG. 26 is a lateral view illustrating the present invention being applied in a LED lamp, according to the first embodiment of the present invention.
Figure 27:
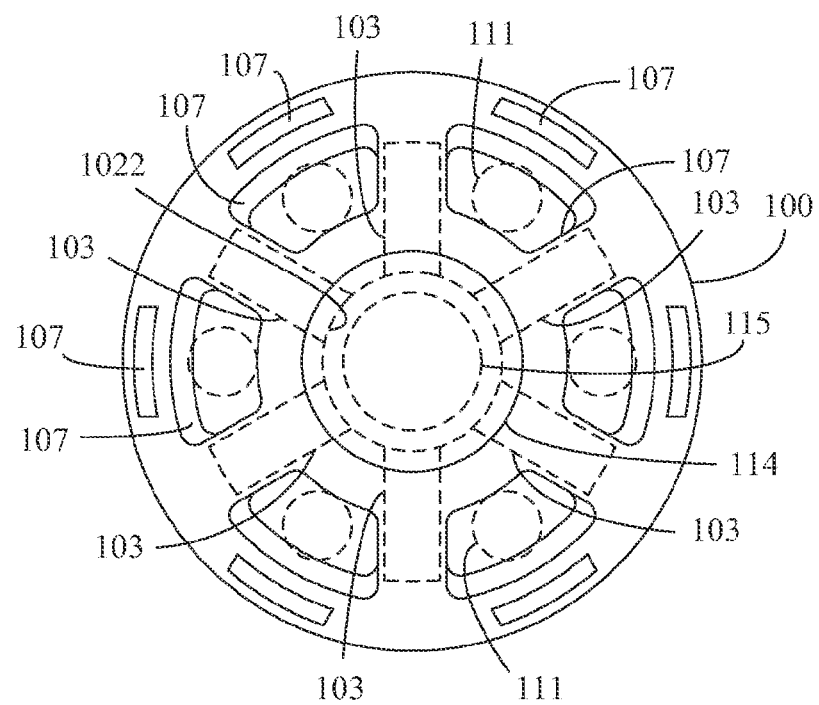
FIG. 27 is a top view of FIG. 26.

FIG. 26 is a lateral view illustrating the present invention being applied in a LED lamp, according to the first embodiment of the present invention;

FIG. 27 is a top view of FIG. 26;

As shown in FIG. 26 and FIG. 27, the light emitting diodes (111) are annularly arranged at the periphery of the central airflow aperture (1022) at the light projection side of the heat dissipation device (100); wherein:

heat dissipation device (100): composed of a material having great heat conductivity, integrally formed or assembled by pieces for forming as a hollow member, the radial outer surface is formed as a plane and smooth surface, rib-like surface, grid-like surface, or formed with a structure having net-like or porous shape or having fins, thereby forming an outer heat dissipation surface (105); the radial inner surface is formed as a plane and smooth surface, rib-like surface, grid-like surface, or formed with a structure having net-like or porous shape or having fins, thereby forming an inner heat dissipation surface (106); the housing dimension at one side of the heat dissipation device (100) is gradually enlarged towards the bottom side, and the outer bottom side is defined as a light projection side, the center of the light projection side is formed with a central airflow aperture (1022) allowing air to flow, the housing dimension at the other side of the heat dissipation device (100) is gradually reduced thereby forming the distal heat dissipating segment (104) which is in a sealed or semi-sealed or opened state for being served as an interface structure connecting with a fastening and electric conducting interface (114);

the housing of the heat dissipation device (100) close to the distal heat dissipating augment (104) is formed with one or more radial airflow apertures (107), and the radial airflow aperture (107) includes being composed of a grid aperture having pore or net-like structure;

the center of the heat dissipation device (100) close to the light projection side is formed with the central airflow aperture (1022), the central airflow aperture (1022) is formed as a single aperture or plural aperture structure, the plural aperture structure include plural individual apertures or net-like apertures or grid-like apertures, and the periphery defined along the central airflow aperture (1022) is annularly installed with the light emitting diodes (111);

the close-loop shunting heat conductive structure (103) is installed between the inner periphery of the central airflow aperture (1022) at the inner side of the heat dissipation device (100) close to the light projection side and the inner heat dissipation surface (106) defined at the mid portion of the radial housing of the heat dissipation device (100), thereby conducting the heat from the light emitting diodes (111) close to the central airflow aperture (1022);

close-loop shunting heat conductive structure (103): composed of a heat conductive material and formed as an individual heat conductive structure, installed between the inner heat dissipation surface (106) defined at the mid portion of the radial housing of the heat dissipation device (100) and the inner periphery of the central airflow aperture (1022), the constitution means includes being integrally formed with the heat dissipation device (100) through a die casting or metal casting or punching or forging or processing means, or individually manufactured for being mounted or laminated or welded or riveted or locked between the inner heat dissipation surface (106) defined at the mid portion of the radial housing of the heat dissipation device (100) and the inner periphery of the central airflow aperture (1022) for conducting heat, the structural configuration includes being formed as a strip-shaped radial structure, or an oblique conical surface, or an oblique conical surface having airflow apertures;

With the mentioned structure, when the light emitting diode (111) is electrically charged and generates heat loss, if the light projection side of the heat dissipation device (100) is downwardly arranged, the hot airflow inside the heat dissipation device (100) generates the hot ascent/cold descent effect, the airflow is then introduced from the central airflow aperture (1022) of the light projection side, and discharged through the radial airflow apertures (107) close to the distal heat dissipating segment (104) thereby generating flowing air for discharging the heat inside the heat dissipation device (100); if the light projection side of the heat dissipation device (100) is upwardly arranged, the air flowing direction is opposite;

light emitting diode (111): composed of light emitting diode (111) or a light emitting diode module, arranged at the outer bottom periphery of the light projection side of the heat dissipation device (100), and served to project light according to the set direction;

secondary optical device (112): composed of a structural device having functions of condensing, defusing, reflecting or refracting the optical energy of the light emitting diode (111) for projecting light to the exterior; the secondary optical device (112) can be optionally installed according to the actual needs;

light pervious lamp cover (113): made of a light pervious material, provided for covering the light emitting diode (111) so as to protect the light emitting diode (111), allowing the optical energy of the light emitting diode (111) to be transferred through for being projected to the exterior; the light pervious lamp cover (113) can be optionally installed according to the actual needs;

fastening and electric conducting interface (114): one side thereof is combined with the distal heat dissipating segment (104) of the heat dissipation device (100), the other side is formed as a screw-in type, mount type or lock type lamp head or lamp seat, or an electric conductive interface structure composed of conductive wires or electric conductive terminals, served as a connection interface to the external electric power, and provided with an electric conductive member for being connected with the light emitting diode (111) through a drive circuit device (115) for conducting electric power;

drive circuit device (115): composed of a solid-state electronic device and/or electromechanical device, provided for converting the electric power from the fastening and electric conducting interface (114) into the electric power for driving the light emitting diode (111), and provided for setting and controlling the voltage and current of the electric power used for driving the light emitting diode (111); the drive circuit device (115) can be optionally installed according to the actual needs;

conductive wire (116): composed of a conductive member having insulation surface, provided for transferring the electric power of the drive circuit device (115) to the light emitting diode (111).

Figure 28:
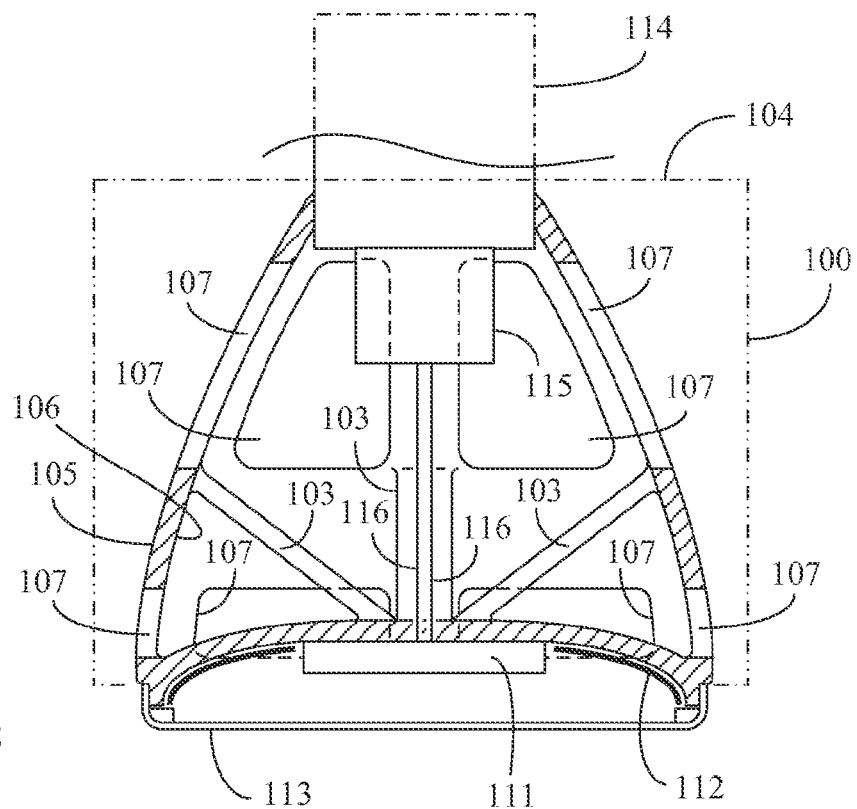
FIG. 28 is a lateral view illustrating the present invention being applied in a LED lamp, according to the second embodiment of the present invention.
Figure 29:
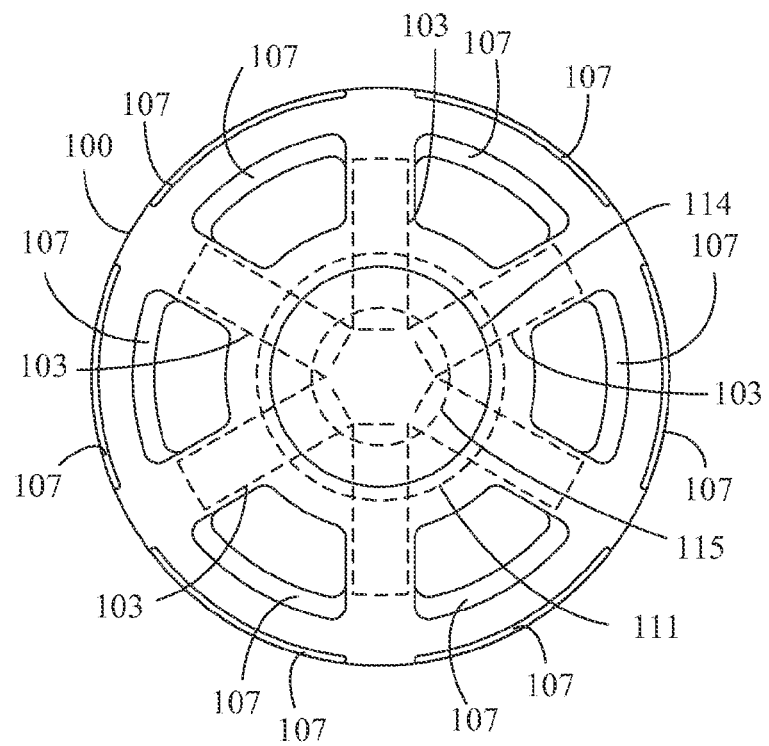
FIG. 29 is a top view of FIG. 28.

FIG. 28 is a lateral view illustrating the present invention being applied in a LED lamp, according to the second embodiment of the present invention;

FIG. 29 is a top view of FIG. 28;

As shown in FIG. 28 and FIG. 29, radial airflow apertures (107) are formed at the periphery of lower layer of the heat dissipation device (100) close to the light projection side, and the light emitting diodes (111) are arranged in the housing of the heat dissipation device (100) at the center of the light projection side; wherein:

heat dissipation device (100): composed of a material having great heat conductivity, integrally formed or assembled by pieces for forming as a hollow member, the radial outer surface is formed as a plane and smooth surface, rib-like surface, grid-like surface, or formed with a structure having net-like or porous shape or having fins, thereby forming an outer heat dissipation surface (105); the radial inner surface is formed as a plane and smooth surface, rib-like surface, grid-like surface, or formed with a structure having net-like or porous shape or having fins, thereby forming an inner heat dissipation surface (106); the housing dimension at one side of the heat dissipation device (100) is gradually enlarged towards the bottom side, and the outer bottom side is defined as a light projection side, the housing dimension at the other side of the heat dissipation device (100) is gradually reduced thereby forming the distal heat dissipating segment (104) which is in a sealed or semi-sealed or opened state for being served as an interface structure connecting with a fastening and electric conducting interface (114);

the housing of the heat dissipation device (100) close to the distal heat dissipating segment (104) is formed with one or more radial airflow apertures (107) at the upper layer and formed with the radial airflow apertures (107) at the lower layer close to the light projection side, the radial airflow apertures (107) at the upper layer and the radial airflow apertures (107) close to the light projection side include being formed as plural individual apertures or a structure having net-like apertures or grid-like apertures;

the center of the housing of the heat dissipation device (100) close to the light projection side is installed with the light emitting diodes (111);

the close-loop shunting heat conductive structure (103) is installed between the center at the inner of the housing of the heat dissipation device (100) close to the light projection side and the inner heat dissipation surface (106) defined at the mid portion of the radial housing of the heat dissipation device (100), thereby conducting the heat from the light emitting diodes (111);

close-loop shunting heat conductive structure (103): composed of a heat conductive material and formed as an individual heat conductive structure, installed between the inner heat dissipation surface (106) defined at the mid portion of the radial housing of the heat dissipation device (100) and the center at the inner of the housing of the heat dissipation device (100) close to the light projection side, the constitution means includes being integrally formed with the heat dissipation device (100) through a die casting or metal casting or punching or forging or processing means, or individually manufactured for being mounted or laminated or welded or riveted or locked between the inner heat dissipation surface (106) defined at the mid portion of the radial housing of the heat dissipation device (100) and the center at the inner of the housing of the heat dissipation device (100) close to the light projection side for conducting heat, the structural configuration includes being formed as a strip-shaped radial structure, or an oblique conical surface, or an oblique conical surface having airflow apertures;

With the mentioned structure, when the light emitting diode (111) is electrically charged and generates heat loss, if the light projection side of the heat dissipation device (100) is downwardly arranged, the hot airflow inside the heat dissipation device (100) generates the hot ascent/cold descent effect, airflow is then introduced from the radial airflow apertures (107) at the lower side of the outer heat dissipation surface (105) close to the light projection side, and discharged through the radial airflow apertures (107) at the higher side close to the distal heat dissipating segment (104) thereby generating flowing air for discharging the heat inside the heat dissipation device (100); if the light projection side of the heat dissipation device (100) is upwardly arranged, the air flowing direction is opposite;

light emitting diode (111): composed of light emitting diode (111) or a light emitting diode module, arranged at the center of outer bottom of the light projection side of the heat dissipation device (100), and served to project light according to the set direction;

secondary optical device (112): composed of a structural device having functions of condensing, defusing, reflecting or refracting the optical energy of the light emitting diode (111) for projecting light to the exterior; the secondary optical device (112) can be optionally installed according to the actual needs;

light pervious lamp cover (113): made of a light pervious material, provided for covering the light emitting diode (111) so as to protect the light emitting diode (111), allowing the optical energy of the light emitting diode (111) to be transferred through for being projected to the exterior; the light pervious lamp cover (113) can be optionally installed according to the actual needs;

fastening and electric conducting interface (114): one side thereof is combined with the distal heat dissipating segment (104) of the heat dissipation device (100), the other side is formed as a screw-in type, mount type or lock type lamp head or lamp seat, or an electric conductive interface structure composed of conductive wires or electric conductive terminals, served as a connection interface to the external electric power, and provided with an electric conductive member for being connected with the light emitting diode (111) through a drive circuit device (115) for conducting electric power;

drive circuit device (115): composed of a solid-state electronic device and/or electromechanical device, provided for converting the electric power from the fastening and electric conducting interface (114) into the electric power for driving the light emitting diode (111), and provided for setting and controlling the voltage and current of the electric power used for driving the light emitting diode (111); the drive circuit device (115) can be optionally installed according to the actual needs;

conductive wire (116): composed of a conductive member having insulation surface, provided for transferring the electric power of the drive circuit device (115) to the light emitting diode (111).

Figure 30:
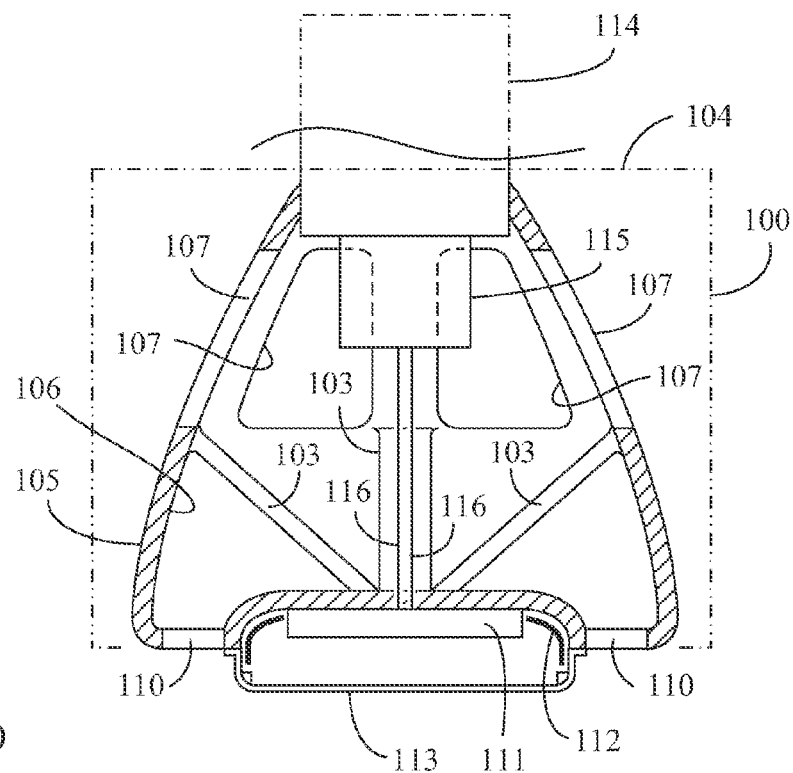
FIG. 30 is a lateral view illustrating the present invention being applied in a LED lamp, according to the third embodiment of the present invention.
Figure 31:
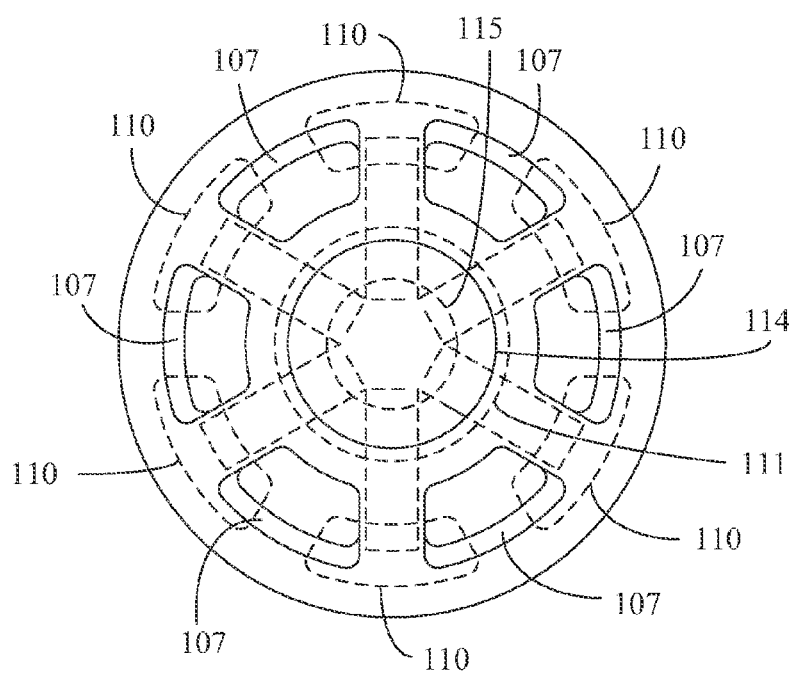
FIG. 31 is a top view of FIG. 30.

FIG. 30 is a lateral view illustrating the present invention being applied in a LED lamp, according to the third embodiment of the present invention;

FIG. 31 is a top view of FIG. 30;

As shown in FIG. 30 and FIG. 31, annularly-arranged axial airflow apertures (110) are formed at the periphery of the light projection side of the heat dissipation device (100), and the light emitting diodes (111) are arranged at the center of the housing of the heat dissipation device (100) at the light projection side; wherein:

heat dissipation device (100): composed of a material having great heat conductivity, integrally formed or assembled by pieces for forming as a hollow member, the radial outer surface is formed as a plane and smooth surface, rib-like surface, grid-like surface, or formed with a structure having net-like or porous shape or having fins, thereby forming an outer heat dissipation surface (105); the radial inner surface is formed as a plane and smooth surface, rib-like surface, grid-like surface, or formed with a structure having net-like or porous shape or having fins, thereby forming an inner heat dissipation surface (106); the housing dimension at one side of the heat dissipation device (100) is gradually enlarged towards the bottom side, and the outer bottom side is defined as a light projection side, the annularly-arranged axial airflow apertures (110) are formed at the periphery of the light projection side, and the housing dimension at the other side of the heat dissipation device (100) is gradually reduced thereby forming the distal heat dissipating segment (104) which is in a sealed or semi-sealed or opened state for being served as an interface structure connecting with a fastening and electric conducting interface (114);

the housing of the heat dissipation device (100) close to the distal heat dissipating segment (104) is formed with one or more radial airflow apertures (107), the radial airflow apertures (107) include plural individual apertures or a structure having net-like apertures or grid-like apertures;

the bottom side near the outer periphery of the light projection side at the bottom of the housing of the heat dissipation device (100) are annularly formed with annularly-arranged axial airflow apertures (110), the annularly-arranged axial airflow apertures (110) include plural individual apertures or a structure having net-like apertures or grid-like apertures;

the center of the housing of the heat dissipation device (100) close to the light projection side is installed with the light emitting diodes (111);

the close-loop shunting heat conductive structure (103) is installed between the center at the inner of the housing of the heat dissipation device (100) close to the light projection side and the inner heat dissipation surface (106) defined at the mid portion of the radial housing of the heat dissipation device (100), thereby conducting the heat from the light emitting diodes (111);

close-loop shunting heat conductive structure (103): composed of a heat conductive material and formed as an individual heat conductive structure, installed between the inner heat dissipation surface (106) defined at the inner mid portion of the radial housing of the heat dissipation device (100) and the center at the inner of the housing of the heat dissipation device (100) close to the light projection side, the constitution means includes being integrally formed with the heat dissipation device (100) through a die casting or metal casting or punching or forging or processing means, or individually manufactured for being mounted or laminated or welded or riveted or locked between the inner heat dissipation surface (106) defined at the inner mid portion of the radial housing of the heat dissipation device (100) and the center at the inner of the housing of the heat dissipation device (100) close to the light projection side for conducting heat, the structural configuration includes being formed as a strip-shaped radial structure, or an oblique conical surface, or an oblique conical surface having airflow apertures;

With the mentioned structure, when the light emitting diode (111) is electrically charged and generates heat loss, if the light projection side of the heat dissipation device (100) is downwardly arranged, the hot airflow inside the heat dissipation device (100) generates the hot ascent/cold descent effect, airflow is then introduced from the annularly-arranged axial airflow apertures (110) formed at the periphery of the light projection side, and discharged through the radial airflow apertures (107) close to the distal heat dissipating segment (104) thereby generating flowing air for discharging the heat inside the heat dissipation device (100); if the light projection side of the heat dissipation device (100) is upwardly arranged, the air flowing direction is opposite;

light emitting diode (111): composed of light emitting diode (111) or a light emitting diode module, arranged at the center of outer bottom of the light projection side of the heat dissipation device (100), and arranged in a circular and downward-facing state and served to project light according to the set direction;

secondary optical device (112): composed of a structural device having functions of condensing, defusing, reflecting or refracting the optical energy of the light emitting diode (111) for projecting light to the exterior; the secondary optical device (112) can be optionally installed according to the actual needs;

light pervious lamp cover (113): made of a light pervious material, provided for covering the light emitting diode (111) so as to protect the light emitting diode (111), allowing the optical energy of the light emitting diode (111) to be transferred through for being projected to the exterior; the light pervious lamp cover (113) can be optionally installed according to the actual needs;

fastening and electric conducting interface (114): one side thereof is combined with the distal heat dissipating segment (104) of the heat dissipation device (100), the other side is formed as a screw-in type, mount type or lock type lamp head or lamp seat, or an electric conductive interface structure composed of conductive wires or electric conductive terminals, served as a connection interface to the external electric power, and provided with an electric conductive member for being connected with the light emitting diode (111) through a drive circuit device (115) for conducting electric power;

drive circuit device (115): composed of a solid-state electronic device and/or electromechanical device, provided for converting the electric power from the fastening and electric conducting interface (114) into the electric power for driving the light emitting diode (111), and provided for setting and controlling the voltage and current of the electric power used for driving the light emitting diode (111); the drive circuit device (115) can be optionally installed according to the actual needs;

conductive wire (116): composed of a conductive member having insulation surface, provided for transferring the electric power of the drive circuit device (115) to the light emitting diode (111).

Figure 32:
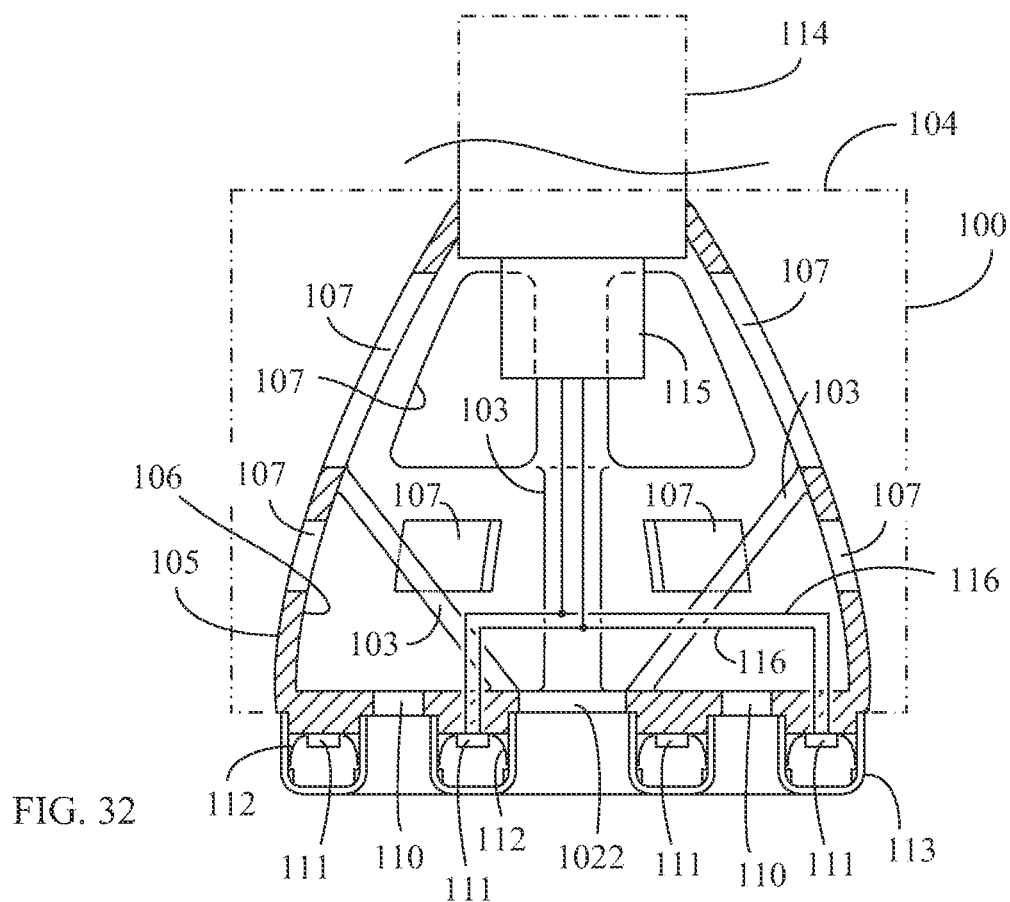
FIG. 32 is a lateral view illustrating the present invention being applied in a LED lamp, according to the fourth embodiment of the present invention.
Figure 33:
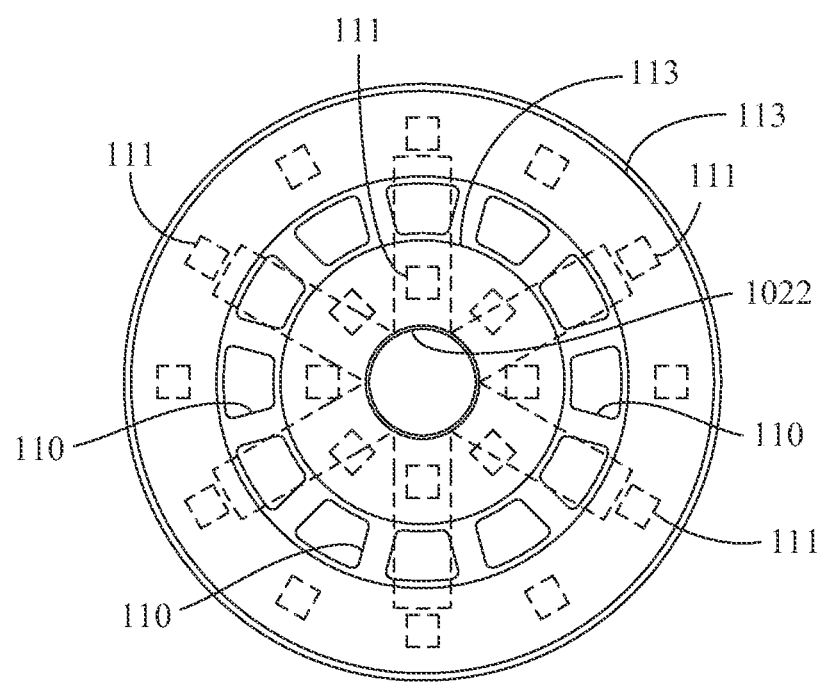
FIG. 33 is a bottom view of FIG. 32.
Figure 34:
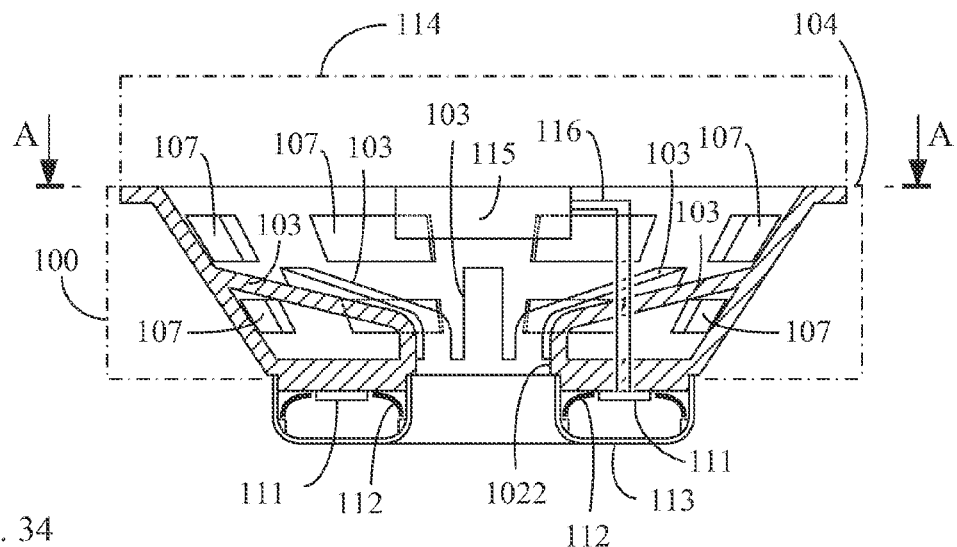
FIG. 34 is a lateral view of the present invention being applied in a LED lamp, according to the fifth embodiment of the present invention.
Figure 35:
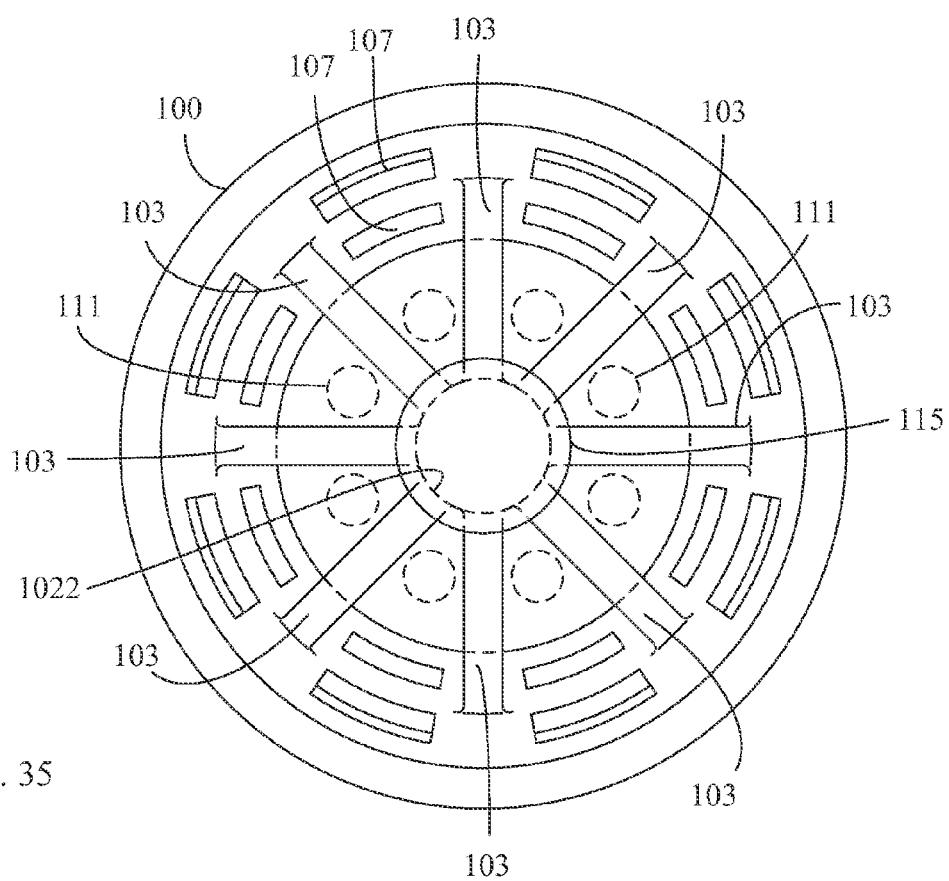
FIG. 35 is a top view of FIG. 34 taken along A-A.
Figure 36:
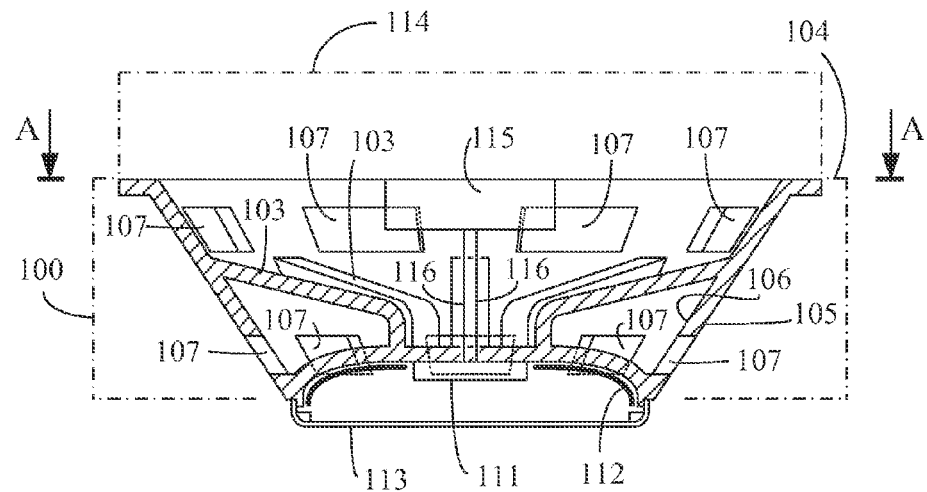
FIG. 36 is a lateral view of the present invention being applied in a LED lamp, according to the sixth embodiment of the present invention.
Figure 37:
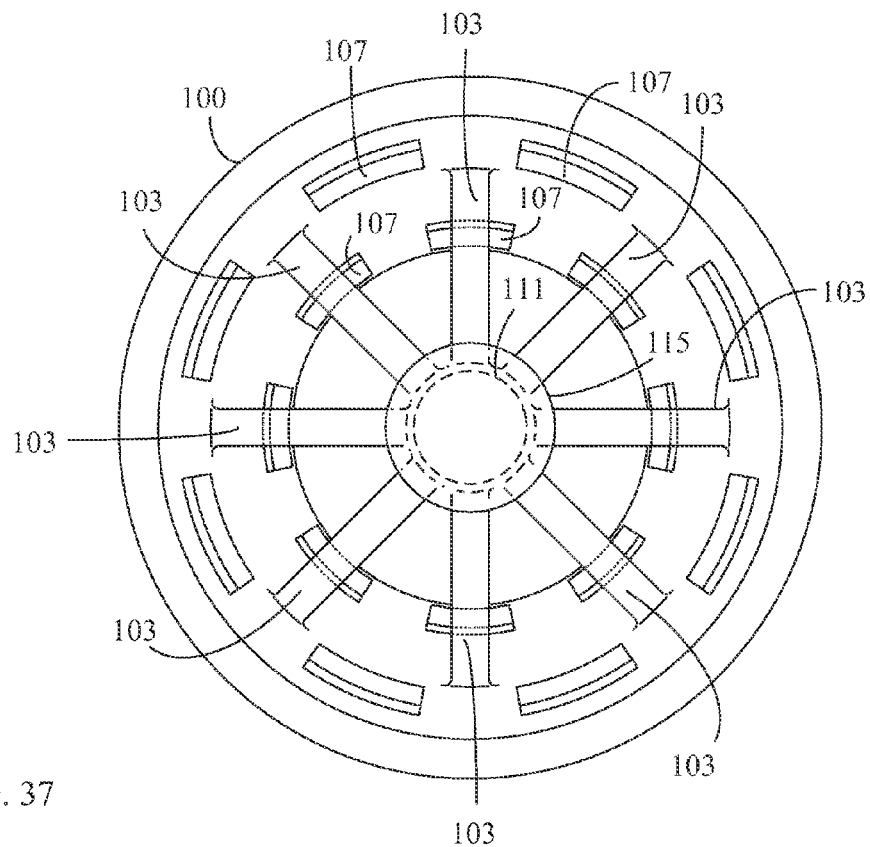
FIG. 37 is a top view of FIG. 36 taken along A-A.
Figure 38:
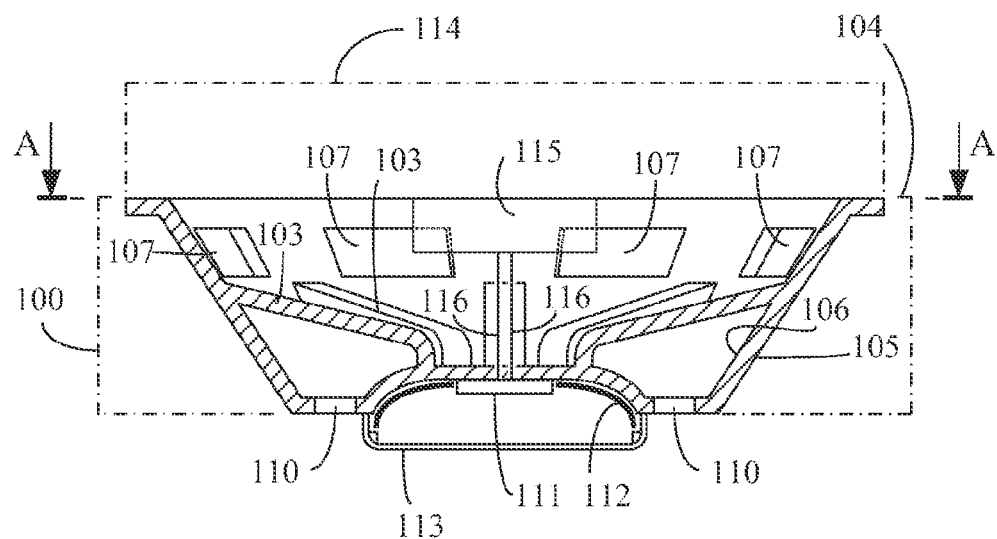
FIG. 38 is a lateral view of the present invention being applied in a LED lamp, according to the seventh embodiment of the present invention.
Figure 39:
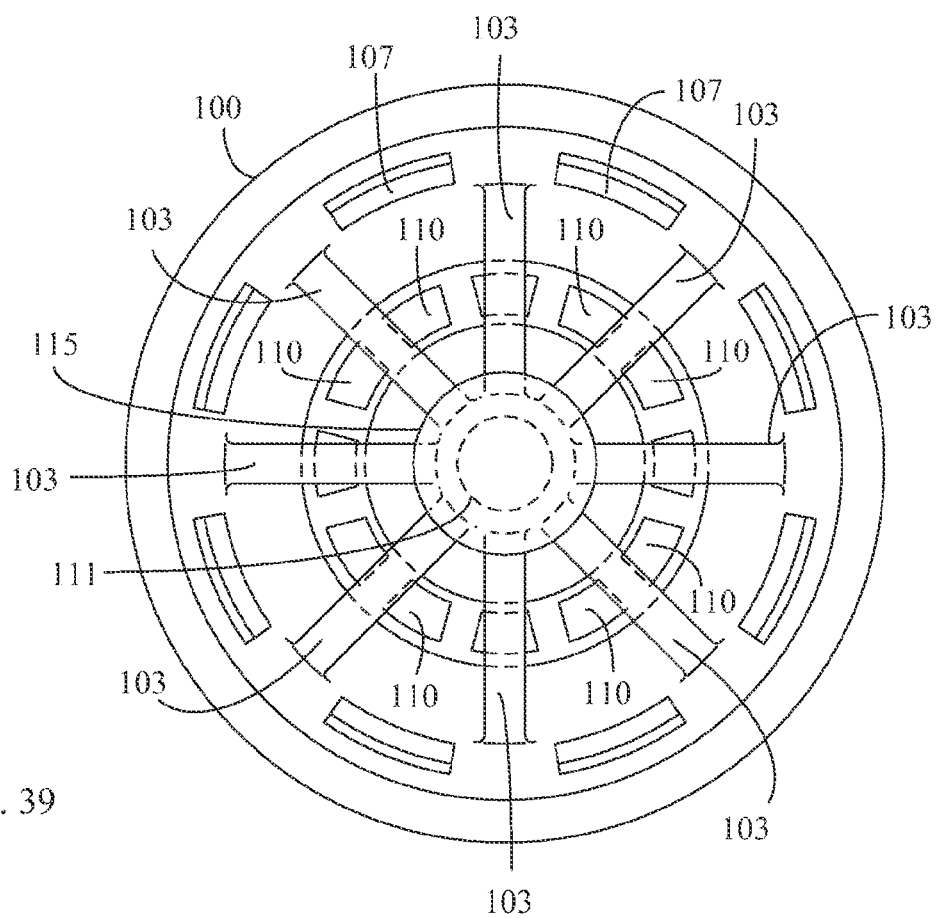
FIG. 39 is a top view of FIG. 38 taken along A-A.
Figure 40:
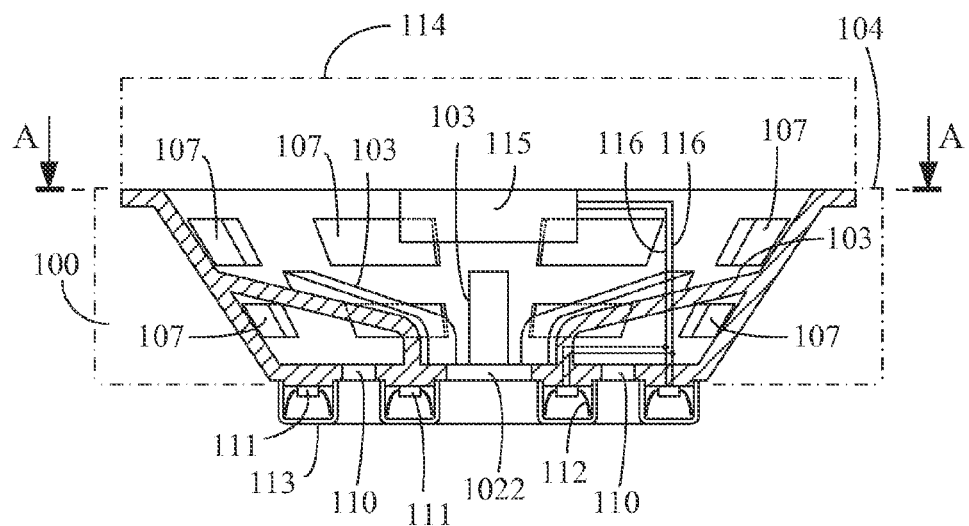
FIG. 40 is a lateral view of the present invention being applied in a LED lamp, according to the eighth embodiment of the present invention.
Figure 41:
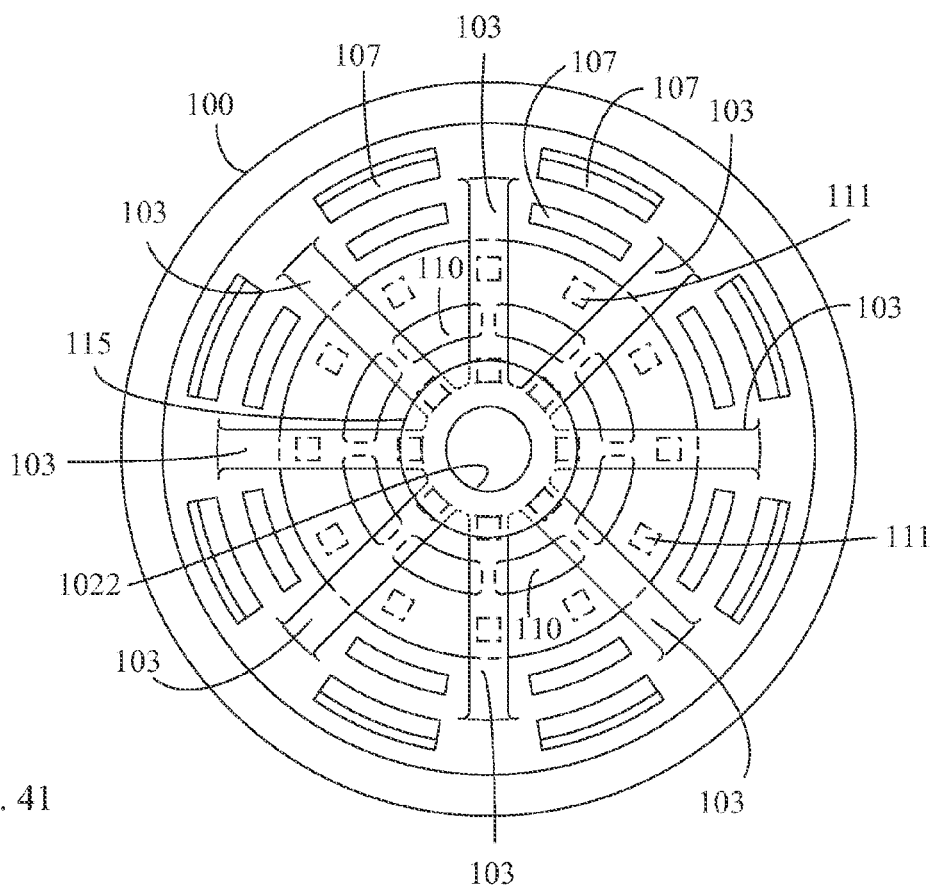
FIG. 41 is a top view of FIG. 40 taken along A-A.
Figure 42:
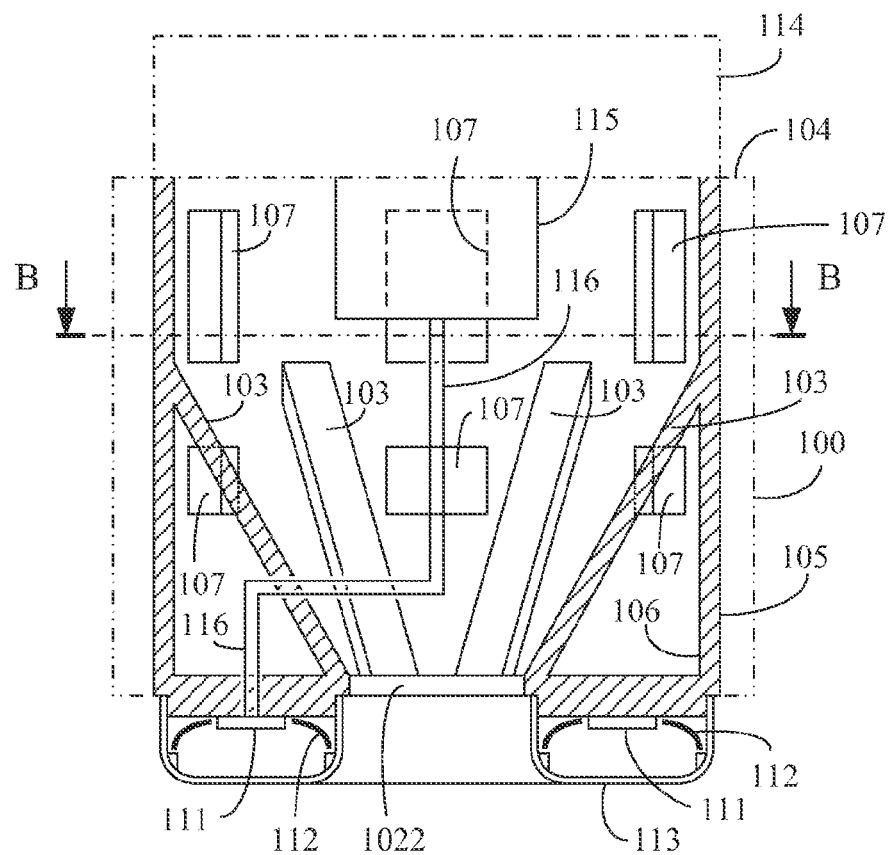
FIG. 42 is a lateral view of the present invention being applied in a LED lamp, according to the ninth embodiment of the present invention.
Figure 43:
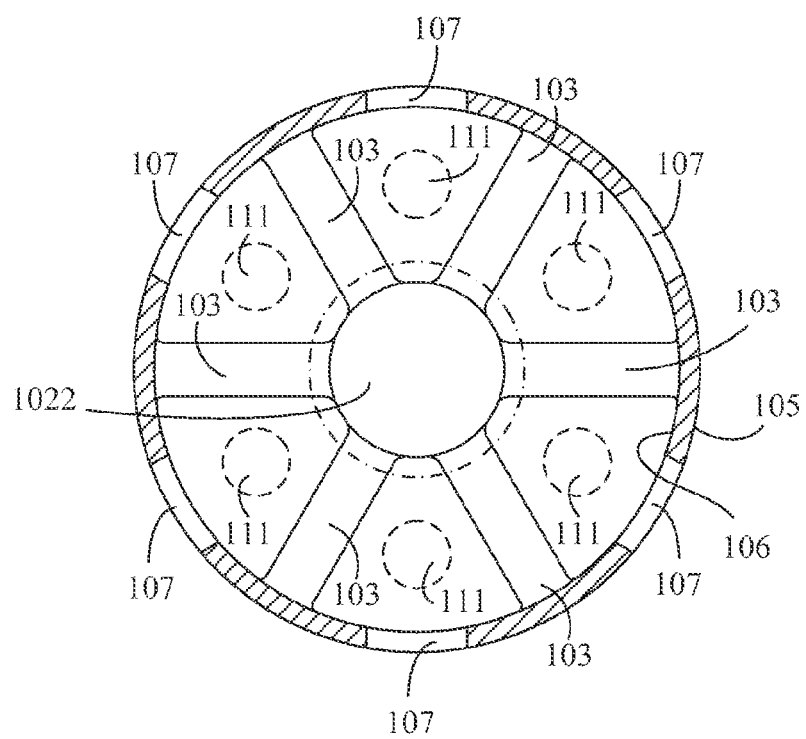
FIG. 43 is a cross sectional view of FIG. 42 taken along B-B.
Figure 44:
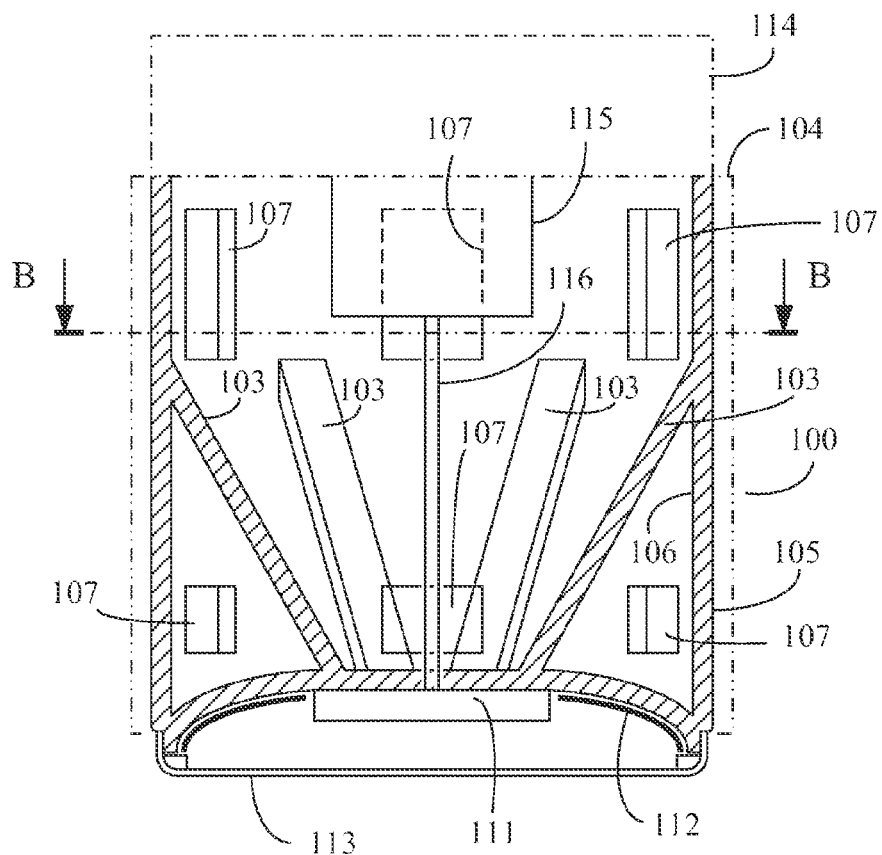
FIG. 44 is a lateral view of the present invention being applied in a LED lamp, according to the tenth embodiment of the present invention.
Figure 45:
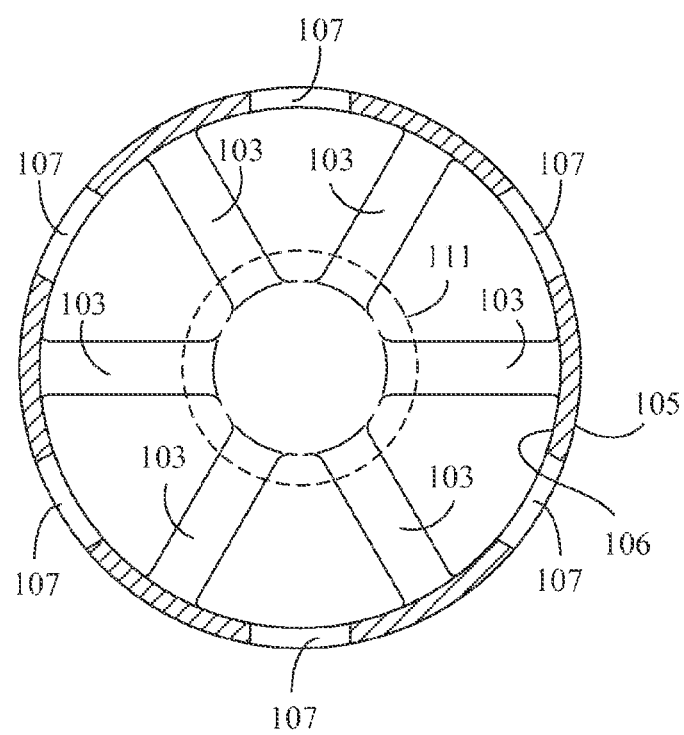
FIG. 45 is a cross sectional view of FIG. 44 taken along B-B.
Figure 46:
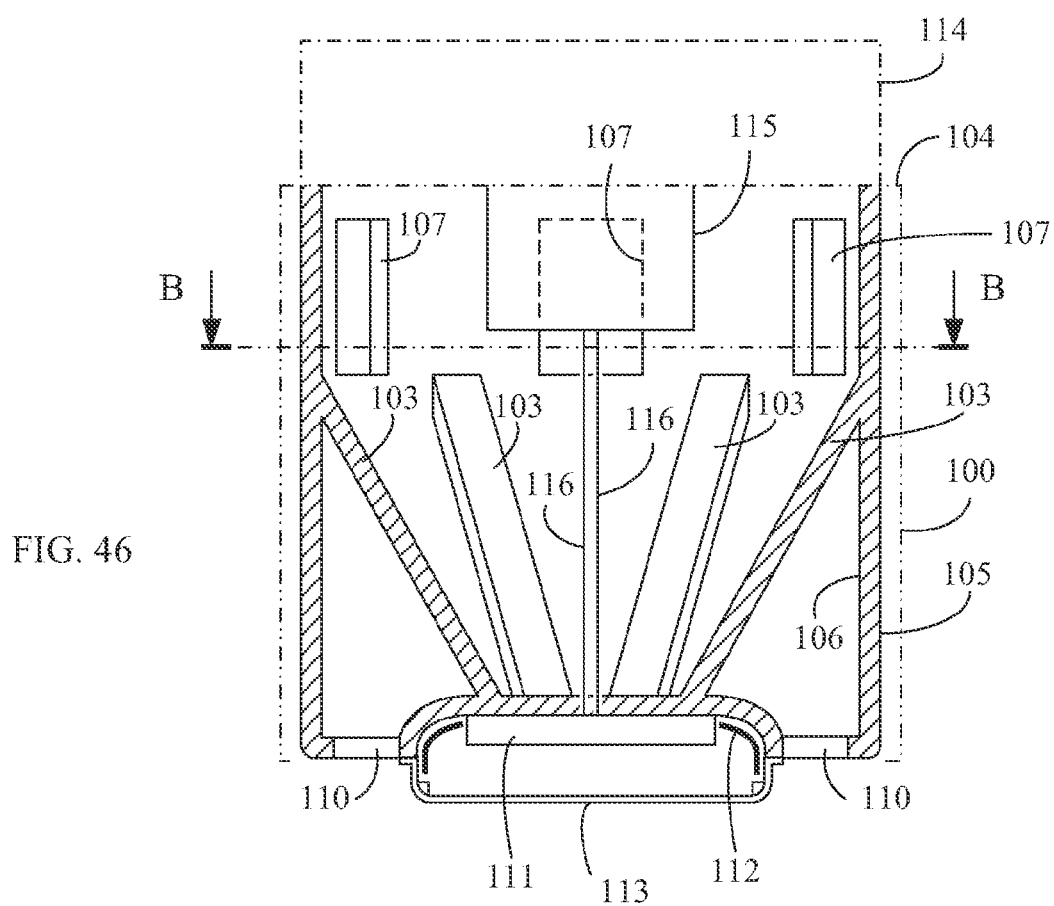
FIG. 46 is a lateral view of the present invention being applied in a LED lamp, according to the eleventh embodiment of the present invention.
Figure 47:
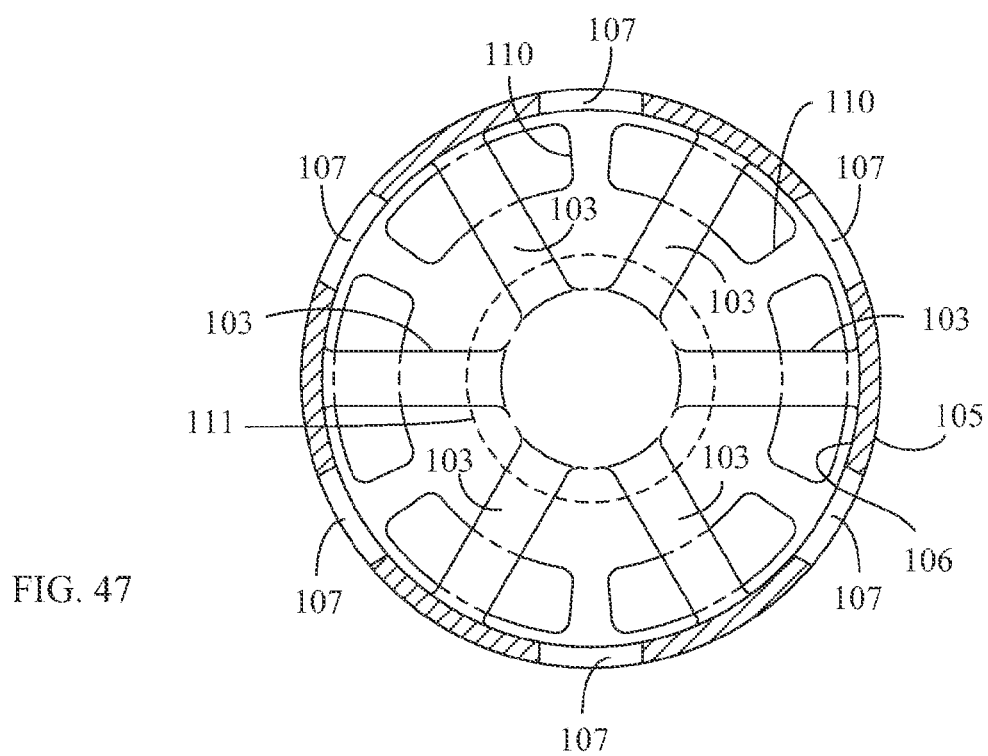
FIG. 47 is a cross sectional view of FIG. 46 taken along B-B.
Figure 48:
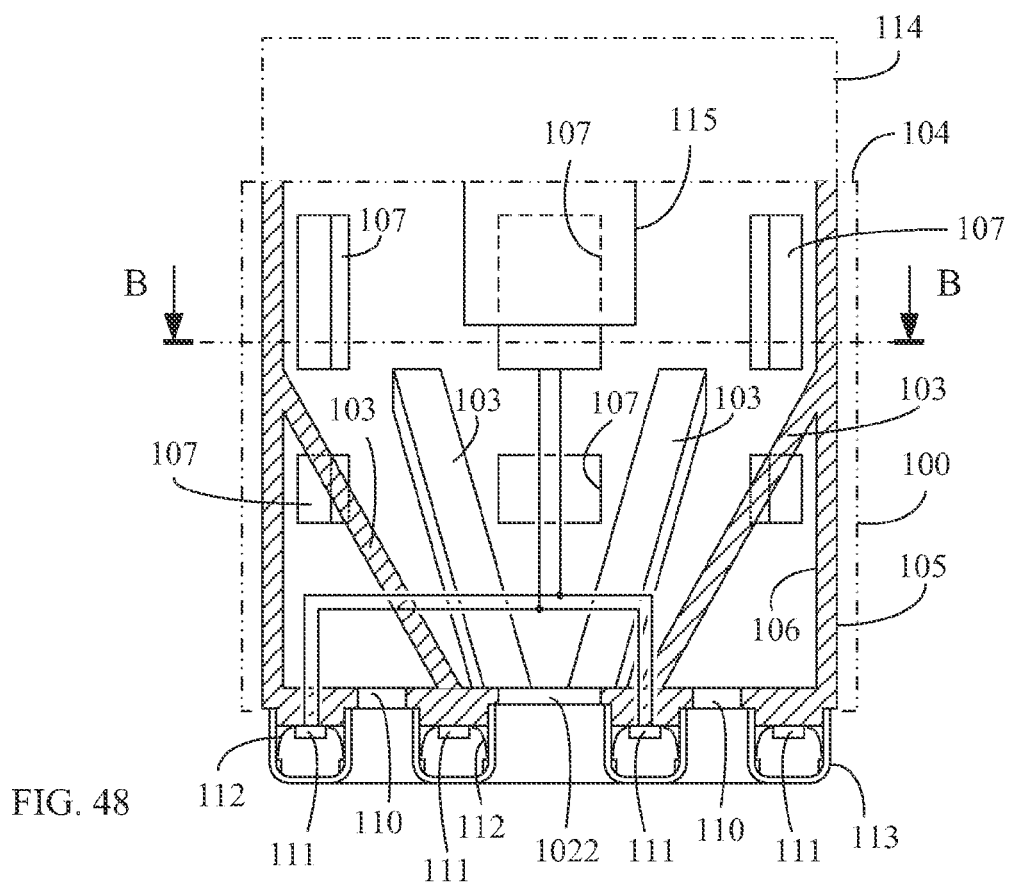
FIG. 48 is a lateral view of the present invention being applied in a LED lamp, according to the twelfth embodiment of the present invention.
Figure 49:
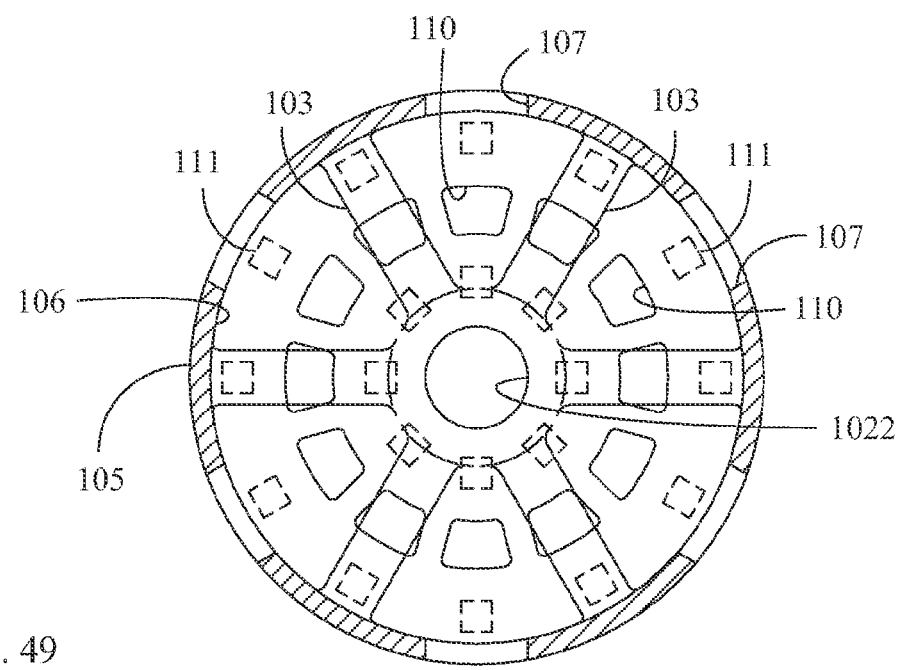
FIG. 49 is a cross sectional view of FIG. 48 taken along B-B.

FIG. 32 is a lateral view illustrating the present invention being applied in a LED lamp, according to the fourth embodiment of the present invention;

FIG. 33 is a bottom view of FIG. 32;

As shown in FIG. 32 and FIG. 33, the annularly-arranged axial airflow apertures (110) are annularly formed at the periphery of the light projection side of the heat dissipation device (100) and the central airflow aperture (1022) is formed at the center of the light project side, the light emitting diodes (111) are arranged between the central airflow aperture (1022) and the annually-arranged axial airflow apertures (110) at the light projection side of the heat dissipation device (100); wherein:

heat dissipation device (100): composed of a material having great heat conductivity, integrally formed or assembled by pieces for forming as a hollow member, the radial outer surface is formed as a plane and smooth surface, rib-like surface, grid-like surface, or formed with a structure having net-like or porous shape or having fins, thereby forming an outer heat dissipation surface (105); the radial inner surface is formed as a plane and smooth surface, rib-like surface, grid-like surface, or formed with a structure having net-like or porous shape or having fins, thereby forming an inner heat dissipation surface (106); the housing dimension at one side of the heat dissipation device (100) is gradually enlarged towards the bottom side, and the outer bottom side is defined as a light projection side, the center of the light projection side is formed with the central airflow aperture (1022) allowing air to flow thereby forming axial apertures and the annularly-arranged axial airflow apertures (110) which are annularly arranged, the housing dimension at the other side of the heat dissipation device (100) is gradually reduced thereby forming the distal heat dissipating segment (104) which is in a sealed or semi-sealed or opened state for being served as an interface structure connecting with a fastening and electric conducting interface (114);

the housing of the heat dissipation device (100) close to the distal heat dissipating segment (104) is formed with one or more radial airflow apertures (107), the radial airflow apertures (107) include plural individual apertures or net-like apertures or grid-like apertures;

the light emitting diodes (111) are annularly arranged between the central airflow aperture (1022) close to the light projection side of the heat dissipation device (100) and the annularly-arranged axial airflow apertures (110); wherein the central airflow aperture (1022) includes single aperture or plural aperture structure, the plural aperture structure include plural individual apertures or net-like apertures or grid-like apertures, the annularly-arranged axial airflow apertures (110) include plural individual apertures or a structure having net-like apertures or grid-like apertures;

the close-loop shunting heat conductive structure (103) is installed between the inner periphery of the central airflow aperture (1022) at the inner side of the housing of the heat dissipation device (100) close to the light projection side and the inner heat dissipation surface (106) defined at the mid portion of the radial housing of the heat dissipation device (100), thereby conducting the heat from the light emitting diodes (111) adjacent to the central airflow aperture (1022);

close-loop shunting heat conductive structure (103): composed of a heat conductive material and formed as an individual heat conductive structure, installed between the inner heat dissipation surface (106) defined at the inner mid portion of the radial housing of the heat dissipation device (100) and the inner periphery of the central airflow aperture (1022), the constitution means includes being integrally formed with the heat dissipation device (100) through a die casting or metal casting or punching or forging or processing means, or individually manufactured for being mounted or laminated or welded or riveted or locked between the inner heat dissipation surface (106) defined at the inner mid portion of the radial housing of the heat dissipation device (100) and the inner periphery of the central airflow aperture (1022) for conducting heat, the structural configuration includes being formed as a strip-shaped radial structure, or an oblique conical surface, or an oblique conical surface having airflow apertures;

With the mentioned structure, when the light emitting diode (111) is electrically charged and generates heat loss, if the light projection side of the heat dissipation device (100) is downwardly arranged, the hot airflow inside the heat dissipation device (100) generates the hot ascent/cold descent effect, airflow is then introduced from the central airflow aperture (1022) and the annularly-arranged axial airflow apertures (110) of the light projection side, and discharged through the radial airflow apertures (107) close to the distal heat dissipating segment (104) thereby generating flowing air for discharging the heat inside the heat dissipation device (100); if the light projection side of the heat dissipation device (100) is upwardly arranged, the air flowing direction is opposite;

light emitting diode (111): composed of light emitting diode (111) or a light emitting diode module, arranged between the outer periphery of the central airflow aperture (1022) and the annularly-arranged axial airflow apertures (110) of the light projection side of the heat dissipation device (100), and between the annularly-arranged axial airflow apertures (110) and the outer periphery of the heat dissipation device (100), downward-facing arranged in ring shape in two or more rings, and served to project light according to the set direction;

secondary optical device (112): composed of a structural device having functions of condensing, defusing, reflecting or refracting the optical energy of the light emitting diode (111) for projecting light to the exterior; the secondary optical device (112) can be optionally installed according to the actual needs;

light pervious lamp cover (113): made of a light pervious material, provided for covering the light emitting diode (111) so as to protect the light emitting diode (111), allowing the optical energy of the light emitting diode (111) to be transferred through for being projected to the exterior; the light pervious lamp cover (113) can be optionally installed according to the actual needs;

fastening and electric conducting interface (114): one side thereof is combined with the distal heat dissipating segment (104) of the heat dissipation device (100), the other side is formed as a screw-in type, mount type or lock type lamp head or lamp seat, or an electric conductive interface structure composed of conductive wires or electric conductive terminals, served as a connection interface to the external electric power, and provided with an electric conductive member for being connected with the light emitting diode (111) through a drive circuit device (115) for conducting electric power;

drive circuit device (115): composed of a solid-state electronic device and/or electromechanical device, provided for converting the electric power from the fastening and electric conducting interface (114) into the electric power for driving the light emitting diode (111), and provided for setting and controlling the voltage and current of the electric power used for driving the light emitting diode (111); the drive circuit device (115) can be optionally installed according to the actual needs;

conductive wire (116): composed of a conductive member having insulation surface, provided for transferring the electric power of the drive circuit device (115) to the light emitting diode (111).

According to heat dissipation device having lateral-spreading heat dissipating and shunting heat conductive structure of the present invention, the structural members and the structural characteristics can be selected from the followings with respect to the actual application, including:

the heat dissipation device (100), the heat dissipation device having U-shaped structure (1000), or the heat dissipation device having tubular structure (2000) is installed with a part or all of the central airflow aperture (1022), the annularly-arranged axial airflow aperture (110), the radial airflow aperture (107), the airflow aperture (1023) and the airflow aperture (1052), and the installed quantity of each type of the airflow apertures.

According to the heat dissipation device having lateral-spreading heat dissipating and shunting heat conductive structure of the present invention, the geometric shape of the housing of the heat dissipation device (100) can be formed as the following geometric shapes according to the actual applications, wherein the hollow housing cross section of the heat dissipation device (100) includes:

(1) the housing cross section of the heat dissipation device (100) is formed as a hollow tubular structure with round or round-like shape; or (2) the housing cross section of the heat dissipation device (100) is formed as a hollow tubular structure having polygonal shape with three or more sides or polygonal-like shape.

According to the heat dissipation device having lateral-spreading heat dissipating and shunting heat conductive structure of the present invention, the housing contour of the heat dissipation device (100) includes:

(1) the housing contour of the heat dissipation device (100) is formed as a hollow cup-shaped member having smaller top and larger bottom (as shown from FIG. 26 to FIG. 33); or (2) the housing contour of the heat dissipation device (100) is formed as a hollow cup-shaped member having larger top and smaller bottom (as shown from FIG. 34 to FIG. 41); or (3) the housing contour of the heat dissipation device (100) is formed as a hollow cup-shaped member being parallel or substantially-parallel (as shown from FIG. 42 to FIG. 49).

The invention claimed is:

1. A heat dissipation device comprising:
a lateral-spreading heat dissipating structure (102) having a base structure, said base structure having a top surface and a bottom surface;
a closed-loop shunting heat conductive structure (103) having a first end and a second end;
a distal heat dissipating segment (104) configured to dissipate heat to an exterior of the heat dissipation device, said distal heat dissipating segment (104) connected to at least one end of the lateral-spreading heat dissipating structure (102); and
a heat generating unit (101), said heat generating unit connected to the top surface or the bottom surface of the base structure, wherein the first end of the closed-loop shunting heat conductive structure (103) is connected on the opposite surface of the base structure than the heat generating unit (101) and the second end of the closed-loop shunting heat conductive structure (103) is connected to the distal heat dissipating segment (104) so that heat generated from the heat generating unit (101) is conductable through the closed-loop shunting heat conductive structure (103) and through the lateral-spreading heat dissipating structure (102) to the distal heat dissipating segment (104) to be dissipated to the exterior of the heat dissipation device, and wherein the lateral-spreading heat dissipating structure (102) comprises a different heat-conductive material than the closed-loop shunting heat conductive structure (103).

2. The heat dissipation device according to claim 1, wherein the heat dissipation device comprises a heat conductive material selected from the group consisting of aluminum, copper, a metal alloy, and ceramic material.

3. The heat dissipation device according to claim 1, wherein the heat generating unit is provided at a center of the base structure, and
wherein the first end of the closed-loop shunting heat conductive structure is connected to a central area at the center of the base structure of the lateral-spreading heat dissipating structure.

4. The heat dissipation device according to claim 1, wherein the heat generating unit comprises at least one of a lamp configured to emit light and generate heat as a result of the emission of light, an electrically-charged heating member, or a heat conductive material configured to receive heat from a source external to the heat dissipation device, wherein the heat generating unit is installed at a center area on the bottom surface of the base structure, wherein said lateral-spreading heat dissipating structure extends radially and outwardly from the center area of the base structure and said distal heat dissipating segment extends upwardly from the base structure so that heat is conductable to the distal heat dissipating segment to dissipate the heat to the exterior.

5. The heat dissipation device according to claim 1, wherein the closed-loop shunting heat conductive structure comprises a heat conductive material, and said closed-loop shunting heat conductive structure being combined or welded with the base structure of the heat dissipation device proximate to the heat generating unit and at a combining location with the distal heat dissipating segment.

6. The heat dissipation device according to claim 1, wherein the base structure of the lateral-spreading heat dissipating structure has a first end and a second end, wherein the heat generating unit is provided proximate the first end of the base structure at the bottom surface of the base structure, and the first end of the closed-loop shunting heat conductive structure is connected to the first end of the base structure and the distal heat dissipating segment is connected to the second end of the base structure.

7. The heat dissipation device according to claim 6, wherein the distal heat dissipating segment extends upwardly away from either the top surface or the bottom surface of the base structure.

8. The heat dissipation device according to claim 1, wherein the distal heat dissipating segment extends upwardly away from either the top surface or the bottom surface of the base structure, wherein the heat generating unit is provided at a center of the lateral-spreading heat dissipating structure, wherein the first end of the closed-loop shunting heat conductive structure is connected to the base structure at the center of the lateral-spreading heating dissipating structure and the second end of the closed-loop shunting heat conductive structure is connected to the upwardly extending distal heat dissipating segment in a way such that a temperature difference at the center of the lateral-spreading heat dissipating structure and a distal location of the distal heat dissipating segment is reduced.

9. The heat dissipation device according to claim 1, wherein the heat dissipation device is formed as a U-shaped plate shaped, a circular cup-like shaped, a polygonal cup-like shaped, or formed in a fork-like cup-shaped structure.

10. The heat dissipation device according to claim 1, further comprising at least a second heat generating unit, wherein the heat generating unit and the at least one second heat generating unit are annularly arranged on the base structure around a center of the base structure of the lateral-spreading heat dissipating structure, wherein the distal heat dissipating segment extends upwardly away from either the top surface or the bottom surface of the base structure, wherein the first end of the closed-loop shunting heat conductive structure is connected to the base structure proximate to the center of the base structure and the second end of the closed-loop shunting heat conductive structure is connected to a distal end of the upwardly extending distal heat dissipating segment in a way such that a temperature difference at the center of the lateral-spreading heat dissipating structure and the distal location of the distal heat dissipating segment is reduced.

11. The heat dissipation device according to claim 10, further comprising a central airflow aperture at a center of the base structure, wherein the heat generating unit and the at least one second heat generating unit are annularly arranged on the base structure around a periphery of the central airflow aperture.

12. The heat dissipation device according to claim 11, wherein the central airflow aperture is formed as a single aperture or plural aperture structure.

13. The heat dissipation device according to claim 12, wherein the plural aperture structure includes plural individual apertures or net-like apertures or grid-like apertures.

14. The heat dissipation device according to claim 10, wherein the base structure further comprises at least two airflow aperture formed at an outer periphery of the base structure.

15. The heat dissipation device according to claim 1, wherein the heat dissipation device has a U-shaped structure, wherein at least one of the closed-loop shunting heat conductive structure and the distal heat dissipating segment comprises at least one airflow aperture, and wherein a top edge of the distal heat dissipating segment is formed with a multiple-surface or annular or tooth-like crown or fork-like structure.

16. The heat dissipation device according to claim 1, wherein the heat dissipation device has a U-shaped structure, wherein at least one of the closed-loop shunting heat conductive structure and the distal heat dissipating segment comprise a radial grid heat dissipation space.

17. The heat dissipation device according to claim 1, wherein the heat dissipation device has a tubular structure, wherein at least one of the closed-loop shunting heat conductive structure, the distal heat dissipating segment, and the heat dissipation device has at least one airflow aperture.

18. The heat dissipation device according to claim 17, wherein the heat dissipation device having the tubular structure has an opened or sealed or semi-sealed top structure, wherein the lateral-spreading heat dissipating structure is formed as a round plate-like structure as a bottom of the heat dissipation device, wherein the distal heat dissipating segment extends upwardly away from the top surface of the base structure of the lateral-spreading heat dissipating structure forming walls of the heat dissipation device, wherein airflow apertures are radially-arranged around a periphery of the walls of the heat dissipation device at a center area of the distal heat dissipating segment, and wherein the heat generating unit is provided at a center portion of the bottom surface of the base structure.

19. The heat dissipation device according to claim 1, wherein the heat dissipation device has a tubular structure having a top formed as an opened or sealed or semi-sealed structure, a bottom thereof formed by the lateral-spreading heat dissipating structure, said lateral-spreading heat dissipating structure being formed as a round plate shaped bottom, and walls formed by the distal heat dissipating segment, said distal heat dissipating segment formed to extend upwardly away from the top surface of the base structure,
wherein at least one of the closed-loop shunting heat conductive structure and the distal heat dissipating segment is formed with a radial grid heat dissipation space,
wherein airflow apertures are formed on at least one of the closed-loop shunting heat conductive structure, the lateral-spreading heat dissipating structure, and the distal heat dissipating segment, and
wherein the heat generating unit is provided at a center area of the base structure.

20. The heat dissipation device according to claim 1, wherein the heat generating unit comprises at least one of a semiconductor having heat loss, a central process unit, memory, power semiconductor, rectifier, a power-type IC in which heat loss is generated, and a heater, oven, or cooking ware operated through electric power or thermal combustion.

21. A LED lamp comprising:
a heat dissipation device comprising a lateral-spreading heat dissipating structure (102) having a base structure, said base structure having a top surface and a bottom surface, a closed-loop shunting heat conductive structure (103) having a first end and a second end, a distal heat dissipating segment (104) configured to dissipate heat to an exterior of the heat dissipation device, said distal heat dissipating segment (104) connected to at least one end of the lateral-spreading heat dissipating structure, and a heat generating unit (101), said heat generating unit (101) connected to the top surface or the bottom surface of the base structure, wherein the first end of the closed-loop shunting heat conductive structure (103) is connected on the opposite surface of the base structure than the heat generating unit (101) and the second end of the closed-loop shunting heat conductive structure (103) is connected to the distal heat dissipating segment (104) so that heat generated from the heat generating unit (101) is conductable through the closed-loop shunting heat conductive structure (103) and through the lateral-spreading heat dissipating structure (102) to the distal heat dissipating segment (104) to be dissipated to the exterior of the heat dissipation device, and wherein the lateral-spreading heat dissipating structure (102) comprises a different heat-conductive material than the closed-loop shunting heat conductive structure (103),
wherein the lateral-spreading heat dissipating structure (102) is formed as a round plate structure and comprises a central airflow aperture (1022) at a center of the round plate structure, wherein said heat generating unit comprises light emitting diodes (111) arranged annularly around a periphery of the central airflow aperture (1022) on the bottom surface of the base plate, wherein the distal heat dissipating segment (104) extends upwardly from the top surface of the base structure to form walls of the LED lamp, said distal heat dissipating segment (104) extending upwardly from the top surface of the base structure in a way such that the heat dissipating segment curves inwardly towards a center axis of the lateral-spreading heat dissipating structure (102) from a first end of the distal heat dissipating segment (104) connected to the base structure to a second end of the distal heat dissipating segment (104) away from the base structure, said second end of the heat dissipating segment being closer to the center axis of the lateral-spreading heat dissipating structure and forming an open, sealed, or semi-sealed top structure of the LED lamp for connecting with a fastening and electric conducting interface, wherein at least one of the lateral-spreading heat dissipating structure (102) and the distal heat dissipating segment (104) comprises at least one airflow aperture, and wherein the first end of the closed-loop shunting heat conductive structure (103) is connected to the base structure of the lateral-spreading dissipating structure around a periphery of the central airflow aperture.

22. The LED lamp according to claim 21, further comprising a secondary optical device, said secondary optical device comprising a structural device configured to condense, defuse, reflect or refract optical energy from the light emitting diodes to project light to an exterior of the LED lamp.

23. The LED lamp according to claim 21, further comprising a light pervious lamp cover made of a light pervious material configured to cover the light emitting diodes so as to protect the light emitting diodes.

24. The LED lamp according to claim 21, further comprising the fastening and electric conducting interface, wherein one side of the fastening and electric conducting interface is connected to the distal heat dissipating segment and the other side is formed as a screw-in type, mount type, or lock type lamp head or lamp seat, or an electric conductive interface structure composed of conductive wires or electric conductive terminals, said fastening and electric conducting interface being configured to serve as a connection interface to an external electric power, and provided with an electric conductive member configured to connect the light emitting diodes for supplying electric power.

25. The LED lamp according to claim 24, further comprising a drive circuit device composed of a solid-state electronic device and/or electromechanical device configured to convert the electric power from the fastening and electric conducting interface into the electric power for driving the light emitting diodes, and configured to set and control voltage and current of the electric power used for driving the light emitting diodes.

26. The LED lamp according to claim 25, further comprising a conductive wire composed of a conductive member having an insulation surface, said conductive wire configured to transfer the electric power from the drive circuit device to the light emitting diodes.

27. The LED lamp according to claim 21, wherein the closed-loop shunting heat dissipating structure is formed as a strip-shaped radial structure, an oblique conical surface, or an oblique conical surface having airflow apertures.

28. The LED lamp according to claim 21, further comprising peripheral airflow apertures annularly arranged around a periphery of the central airflow aperture, wherein said heat generating unit comprises light emitting diodes arranged annularly around the peripheral airflow apertures on the bottom surface of the base plate.

29. A heat dissipation device comprising:

a lateral-spreading heat dissipating structure (102) having a base structure, said base structure having a top surface and a bottom surface;

a closed-loop shunting heat conductive structure (103) having a first end and a second end;

a distal heat dissipating segment (104) configured to dissipate heat to an exterior of the heat dissipation device, said distal heat dissipating segment (104) connected to at least one end of the lateral-spreading heat dissipating structure (102); and a heat generating unit (101), said heat generating unit connected to the top surface or the bottom surface of the base structure, wherein the first end of the closed-loop shunting heat conductive structure (103) is connected on the opposite surface of the base structure than the heat generating unit (101) and the second end of the closed-loop shunting heat conductive structure (103) is connected to the distal heat dissipating segment (104) so that heat generated from the heat generating unit (101) is conductable through the closed-loop shunting heat conductive structure (103) and through the lateral-spreading heat dissipating structure (102) to the distal heat dissipating segment (104) to be dissipated to the exterior of the heat dissipation device, and wherein at least one of the lateral-spreading heat dissipating structure (102), the distal heat dissipating segment (104), or the closed-loop shunting heat conductive structure (103) comprises at least one aperture for a flowing of airflow.

* * * * *